US010222833B2

(12) United States Patent
Kim et al.

(10) Patent No.: US 10,222,833 B2
(45) Date of Patent: Mar. 5, 2019

(54) FLEXIBLE DEVICE AND CONNECTED DEVICE

(71) Applicant: Samsung Electronics Co., Ltd., Suwon-si, Gyeonggi-do (KR)

(72) Inventors: Sungkwon Kim, Seoul (KR); Sangmin Hyun, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 200 days.

(21) Appl. No.: 15/164,303

(22) Filed: May 25, 2016

(65) Prior Publication Data

US 2016/0349800 A1 Dec. 1, 2016

(30) Foreign Application Priority Data

May 26, 2015 (KR) .................. 10-2015-0072993

(51) Int. Cl.
*G06F 1/16* (2006.01)
*H04M 1/02* (2006.01)
(Continued)

(52) U.S. Cl.
CPC .......... *G06F 1/1652* (2013.01); *G06F 1/1626* (2013.01); *G06F 1/1641* (2013.01);
(Continued)

(58) Field of Classification Search
CPC .... G06F 1/1652; G06F 1/1626; G06F 1/1641; G06F 1/1686; H04M 1/022; H04M 1/0247; H04M 1/0254; H04M 1/0268; H04N 5/2253; H04N 5/0239; H05K 1/028; H05K 2201/10121; H05K 2201/10128; H05K 2201/10151
(Continued)

(56) References Cited

U.S. PATENT DOCUMENTS

| 7,957,765 B1 | 6/2011 | Causey et al. |
| 9,323,378 B2 | 4/2016 | Choe |

(Continued)

FOREIGN PATENT DOCUMENTS

| CN | 102150095 A | 8/2011 |
| CN | 105159405 A | 12/2015 |

(Continued)

OTHER PUBLICATIONS

CN Office Action dated Oct. 31, 2018 issued in CN Application No. 201610362613.9.

*Primary Examiner* — Marnie A Matt
(74) *Attorney, Agent, or Firm* — Jefferson IP Law, LLP

(57) ABSTRACT

An electronic device that includes a flexible display is provided. The electronic device includes a foldable display unit, a foldable functional device portion, and a connecting body that interconnects the display unit and the functional device portion. The display unit and the functional device portion are disposed to face each other so as to provide a first state, and after each of the display unit and the functional device portion is folded, at least a portion of the display unit is disposed in the rear side region to be utilized as a display region and at least a portion of the functional device portion is disposed in the front side region so as to provide a second state of being used as a region of the functional device portion.

26 Claims, 25 Drawing Sheets

(51) Int. Cl.
*H05K 1/02* (2006.01)
*H04N 5/225* (2006.01)
(52) U.S. Cl.
CPC .......... *G06F 1/1686* (2013.01); *H04M 1/022* (2013.01); *H04M 1/0247* (2013.01); *H04M 1/0254* (2013.01); *H04M 1/0268* (2013.01); *H04N 5/2253* (2013.01); *H05K 1/028* (2013.01); *H05K 2201/10121* (2013.01); *H05K 2201/10128* (2013.01); *H05K 2201/10151* (2013.01)
(58) Field of Classification Search
USPC .......................................................... 348/47
See application file for complete search history.

(56) References Cited

U.S. PATENT DOCUMENTS

| | | | | |
|---|---|---|---|---|
| 2004/0160511 A1* | 8/2004 | Boesen | ............... | H04M 1/0237 348/14.02 |
| 2005/0227737 A1* | 10/2005 | Moon | ................ | H04M 1/0237 455/566 |
| 2006/0229117 A1* | 10/2006 | Lehtonen | ............ | H04M 1/0212 455/575.3 |
| 2009/0104931 A1 | 4/2009 | Chiang | | |
| 2009/0104932 A1* | 4/2009 | Chiang | ............... | H04M 1/0247 455/556.1 |
| 2010/0004037 A1* | 1/2010 | Ozawa | ................. | G06F 1/1616 455/575.3 |
| 2010/0064244 A1* | 3/2010 | Kilpatrick, II | ....... | G06F 1/1616 715/773 |
| 2010/0117975 A1* | 5/2010 | Cho | ........................ | G06F 1/1626 345/173 |
| 2011/0241998 A1* | 10/2011 | McKinney | ........... | G06F 1/1616 345/168 |
| 2012/0127061 A1* | 5/2012 | Pegg | ................... | H04M 1/0247 345/1.1 |
| 2013/0215011 A1* | 8/2013 | Ke | ............................ | G06F 3/03 345/156 |
| 2014/0226275 A1 | 8/2014 | Ko et al. | | |
| 2014/0247252 A1 | 9/2014 | Lee | | |
| 2014/0339525 A1 | 11/2014 | Pang et al. | | |
| 2015/0091781 A1* | 4/2015 | Yu | ........................... | G06F 1/163 345/8 |
| 2015/0381929 A1* | 12/2015 | Lee | ..................... | H04M 1/0202 348/14.03 |
| 2016/0363964 A1* | 12/2016 | Shi | ........................ | G06F 1/1681 |
| 2017/0075389 A1* | 3/2017 | Yeom | .................... | G06F 1/1652 |

FOREIGN PATENT DOCUMENTS

| | | |
|---|---|---|
| JP | 2004-258477 A | 9/2004 |
| KR | 20060093873 | 8/2006 |
| KR | 101385277 B1 | 4/2014 |
| WO | 2014119829 A1 | 8/2014 |

* cited by examiner

FLEXIBLE DEVICE AND CONNECTED DEVICE

CROSS-REFERENCE TO RELATED APPLICATION(S)

This application claims the benefit under 35 U.S.C. § 119(a) of a Korean patent application filed on May 26, 2015 in the Korean Intellectual Property Office and assigned Serial number 10-2015-0072993, the entire disclosure of which is hereby incorporated by reference.

TECHNICAL FIELD

The present disclosure relates to a flexible device that includes a flexible display that is capable of being curved, bent, or folded. More particularly, the present disclosure relates to a flexible device that provides a novel platform with an expanded user interface (UI)/user experience (UX) function by providing an expandable and variable display region.

BACKGROUND

A portable device may refer to an electronic device or a communication device that allows a user to store various pieces of information and to enjoy multimedia services (e.g., a game or a video image), as well as to use a communication function (e.g., a voice call or message transmission) while the user carries the electronic device. A portable device may include, for example, a smart phone, a tablet personal computer (PC), a palm PC, a portable game device, a video image/music file reproducer, a cellular phone, or a notebook PC.

Nowadays, it has become possible to execute various contents of a banking business (e.g., small amount payment), a game or multimedia service, and the like, as well as a communication function (e.g., a voice call) using only one portable device. In the beginning, a portable device merely provided a voice call or message transmission service. With the advancement of electronic communication techniques, the size, width, and weight of the portable device have been gradually reduced, and the portable device has been equipped with a security function that enables a banking business, a multimedia function that allows a user to enjoy a game or a video image, a simple business processing function that includes internet or mail transmission/reception, as well as a communication function.

Accordingly, a display mounted on the portable device has also been advanced together with the portable device, and various display devices have been developed. Display devices (a liquid crystal display (LCD) device, a plasma display panel (PDP) device, a field emission display (FED) device, an electro luminescence display (ELD) device, and an organic light emission display (OLED) device) have been developed, and are being developed in the direction of seeking to reduce the thickness, weight, and power consumption thereof.

In addition, the display devices have been developed to be curved, or to be bendable or foldable, and a curved display device has also been adapted to a television (TV), a monitor, a flexible device, or a wearable device.

A general structure of a flexible device according to the related art may include a body and a folding unit. The flexible display may be fixed to the front face of the main body. The folding unit may include a plurality of folding members. The flexible display is folded about the folding unit so that the flexible device is used in various modes.

The above information is presented as background information only to assist with an understanding of the present disclosure. No determination has been made, and no assertion is made, as to whether any of the above might be applicable as prior art with regard to the present disclosure.

SUMMARY

However, since the flexible device according to the related art provides a limited user interface (UI) environment in a fixed display region, the flexible device is limited in expending a UI/user experience (UX) function.

Aspects of the present disclosure are to address at least the above-mentioned problems and/or disadvantages and to provide at least the advantages described below. Accordingly, an aspect of the present disclosure is to provide a flexible device that provides a novel platform with an expanded UI/UX function by providing an expandable and variable display region.

Another aspect of the present disclosure is to provide a flexible device that is capable of providing an expanded UI/UX environment by reconstructing a display region and a functional device section.

Another aspect of the present disclosure is to provide a flexible device in which a new arrangement of functional parts is proposed.

Another aspect of the present disclosure is to provide a flexible device that enables contents to be realistically watched by providing a full-display region.

Another aspect of the present disclosure is to provide a flexible device in which the aspect ratio of a display region may be selectively arranged to be a ratio of 21:9 or 4:3.

In accordance with an aspect of the present disclosure, a flexible device is provided. The flexible device includes a front body that includes a first folding portion, a rear body that includes a second folding portion, and a connecting body that interconnects the front body and the rear body.

In a first state, the front body and the rear body may be arranged to be parallel with each other while maintaining a facing state therebetween, and in a second state, the front body and the rear body are folded along the first folding portion and the second folding portion, respectively, such that at least a portion of the front body is disposed in a rear side region and at least a portion of the rear body is disposed in a front side region.

According to various embodiments of the present disclosure, the front body may include a first external face and a first internal face that is disposed to be opposite to the first external face and faces the rear body, and a flexible full-display is disposed on the first external face.

According to various embodiments of the present disclosure, the flexible display may be folded about the first folding portion to be divided into a first display region that is disposed in the front side region and a second display region that is disposed in the rear side region.

According to various embodiments of the present disclosure, a third display region may be disposed between the first display region and the second display region, and the third display region may be a curved display region that may be at least partially utilized as a UI region.

According to various embodiments of the present disclosure, the rear body may include a second external face and a second internal face that is opposite to the second external face, and the second external face may include at least one functional device.

According to various embodiments of the present disclosure, the second external face may be divided into a first region and a second region with reference to the second folding portion, a detachable camera may be disposed in the first region, and an internal camera and a home key may be disposed in the second region.

According to various embodiments of the present disclosure, in the second state, the second external face is folded about the second folding portion such that the internal camera and the home key are disposed in the front side region and the detachable camera is disposed in the rear side region.

According to various embodiments of the present disclosure, the first region where the detachable camera exists and the second display region are arranged to be parallel to each other not to overlap with the rear side region, and the first display region and the second region, in which the internal camera and the home key exist, are arranged to be parallel to each other not to overlap with the front side region.

According to various embodiments of the present disclosure, in the second state, the second region may act as a grip portion.

According to various embodiments of the present disclosure, in the first state, three dimensional (3D) camera photographing is enabled by the internal camera and the detachable camera.

According to various embodiments of the present disclosure, in the second state, the internal camera may operate as a front camera and the detachable camera may operate as a rear camera.

In accordance with another aspect of the present disclosure, a structure which attaches/detaches the detachable camera to/from the rear body is provided. The structure includes first and second push buttons that are disposed on an outer peripheral surface of the detachable camera to be opposite to each other, and are elastically moved in a direction where the first and second push buttons come closer to each other, first and second hook portions that are moved together following the first and second push buttons, respectively, and first and second connection terminals that are provided to the first and second hook portions, respectively.

The detachable camera may be attached/detached depending on whether the first and second push buttons are pushed.

According to various embodiments of the present disclosure, the connecting body is made of a flexible material, and may include a first connecting body that interconnects one end of the front body and one end of the rear body, and a second connecting body that interconnects another end of the front body and another end of the rear body, and the connecting body may further include a flexible printed circuit board to electrically interconnect the front body and the rear body.

According to various embodiments of the present disclosure, a holding device may be provided between the front body and the rear body to hold a disposed state during a mode switching operation, the holding device may include a magnetic body, and a single protrusion that is provided on a second inner face of the rear body, and first and second recesses that are provided on the first inner face of the front body, the single protrusion may be coupled to the first recess in the first state, and the single protrusion may be coupled to the second recess in the second state.

According to various embodiments of the present disclosure, the first and second recesses may be disposed to be opposite to each other such that, with reference to the first folding portion, the first recess is disposed on one side and the second recess is disposed on another side.

According to various embodiments of the present disclosure, the front body and the rear body are provided with first and second magnetic bodies, respectively, so as to provide a force in a direction to be disposed in the first state or in a direction to be disposed in the second state, and the first and second magnetic bodies provide a first state holding force or a second state holding force.

According to various embodiments of the present disclosure, a receiver duct hole may be further disposed at a side of an upper end of the front body.

According to various embodiments of the present disclosure, the first and second folding portions may be arranged symmetric to each other with reference to the center of the flexible device.

According to various embodiments of the present disclosure, the front body may be configured such that a plurality of touch keys may be arranged on one side face to make an input through a touch operation or a SWYPE operation.

According to various embodiments of the present disclosure, in the first state, the full display may provide a rectangular display region that has an aspect ratio of 21:9, in the second state, the first display region may provide a rectangular display region that has an aspect ratio of 4:3, and the second display region may provide a rectangular display region that has an aspect ratio of 21:9.

Various embodiments of the present disclosure may allow a user to experience the active expansion of a user interface (UI)/user experience (UX) function of a flexible device that enables users' various context correspondences through a change of a screen itself and a physical characteristic structure of a device without being limited to a fixed operating system (OS) experience within a fixed screen and a functional limit of a prescribed application.

Various embodiments of the present disclosure enable physical fastening to a detachable camera, a bicycle, a bike mount, a vehicle interior mount, or a smart wearable device using a standardized mount, thereby providing products that correspond to a user's various contexts through the practical and active changes of the products.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
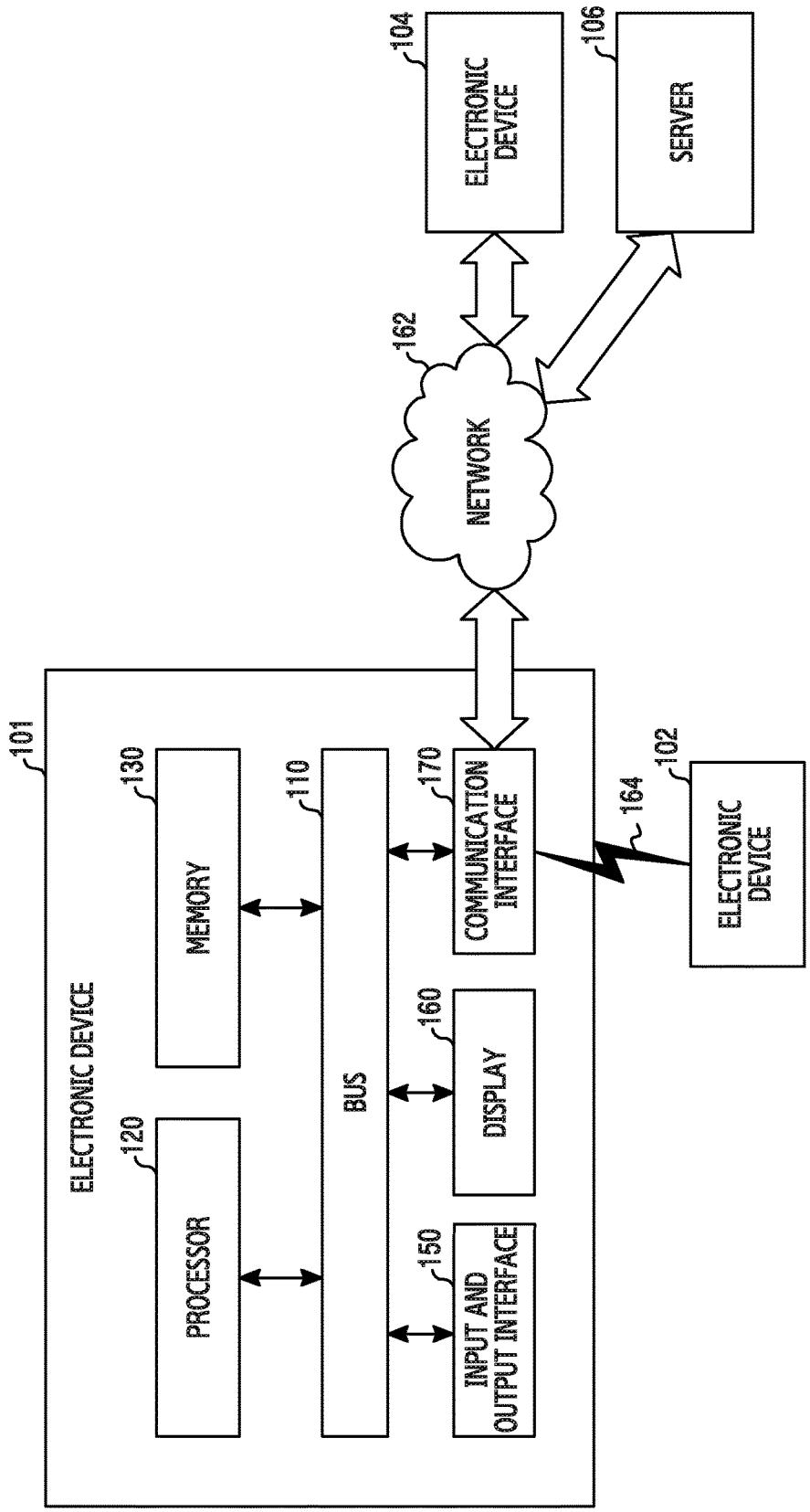
FIG. 1 is a block diagram of an electronic device within a network environment according to various embodiments of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

As used in describing embodiments of the present disclosure, the expressions "include", "may include" and other conjugates refer to the existence of a corresponding disclosed function, operation, or constituent element, and do not limit one or more additional functions, operations, or constituent elements. Further, as used to describe the various embodiments of the present disclosure, the terms "include", "have", and their conjugates merely denote a certain feature, numeral, operation, element, component, or a combination thereof, and do not exclude the existence or possibility of addition of one or more other features, numerals, operations, elements, components, or combinations thereof.

In describing embodiments of the present disclosure, the expression "or" or "at least one of A or/and B" includes any or all of combinations of words listed together. For example, the expression "A or B" or "at least A or/and B" may include A, may include B, or may include both A and B.

In embodiments of the present disclosure, expressions including ordinal numbers, such as "first" and "second," and the like, may modify various elements. However, such elements are not limited by the above expressions. For example, the above expressions do not limit the sequence and/or importance of the elements. The above expressions are used merely for the purpose of distinguishing an element from the other elements. For example, a first user device and a second user device indicate different user devices although both of them are user devices. For example, a first element may be referred to as a second element, and likewise a second element may also be referred to as a first element without departing from the scope of various embodiments of the present disclosure.

When an element is referred to as being "coupled" or "connected" to any other element, it should be understood that not only the element may be coupled or connected directly to the other element, but also a third element may be interposed therebetween. Contrarily, when an element is referred to as being "directly coupled" or "directly connected" to any other element, it should be understood that no other element is interposed therebetween.

Furthermore, all terms used herein, including technical and scientific terms, have the same meaning as commonly understood by those of skill in the art to which the present disclosure pertains. Such terms as those defined in a generally used dictionary are to be interpreted to have the same meanings as the contextual meanings in the relevant field of art, and are not to be interpreted to have ideal or excessively formal meanings unless clearly defined in various embodiments of the present disclosure.

An electronic device according to an embodiment of the present disclosure may be a device including a communication function. For example, the electronic device may include at least one of a smartphone, a tablet personal computer (PC), a mobile phone, a video phone, an electronic book (e-book) reader, a desktop PC, a laptop PC, a netbook computer, a personal digital assistant (PDA), a portable multimedia player (PMP), a moving picture experts group phase 1 or phase 2 (MPEG-1 or MPEG-2) audio layer 3 (MP3) player, a mobile medical appliance, a camera, and a wearable device (e.g., a head-mounted-device, such as electronic glasses, electronic clothes, an electronic bracelet, an electronic necklace, an electronic appcessory, electronic tattoos, a smartwatch, and the like).

According to certain embodiments of the present disclosure, the electronic device may be a smart home appliance with a communication function. For example, the smart home appliance may include at least one of a television (TV), a digital versatile disc (DVD) player, an audio, a refrigerator, an air conditioner, a vacuum cleaner, an oven, a microwave oven, a washing machine, an air cleaner, a set-top box, a TV box (e.g., Samsung HomeSync™, Apple TV™, or Google TV™), a game console, an electronic dictionary, an electronic key, a camcorder, and an electronic photo frame.

According to certain embodiments of the present disclosure, the electronic device may include at least one of various medical appliances (e.g., magnetic resonance angiography (MRA), magnetic resonance imaging (MRI), computed tomography (CT), and ultrasonic machines), navigation equipment, a global positioning system (GPS) receiver, an event data recorder (EDR), a flight data recorder (FDR), automotive infotainment device, electronic equipment for ships (e.g., ship navigation equipment and a gyrocompass), avionics, security equipment, a vehicle head unit, an industrial or home robot, an automatic teller machine (ATM) of a banking system, and a point of sales (POS) of a shop.

According to certain embodiments of the present disclosure, the electronic device may include at least one of a part of furniture or a building/structure, an electronic board, an electronic signature receiving device, a projector, and various kinds of measuring instruments (e.g., a water meter, an electric meter, a gas meter, and a radio wave meter).

The electronic device according to an embodiment of the present disclosure may be a combination of one or more of the aforementioned various devices. Further, the electronic device according to an embodiment of the present disclosure may be a flexible device. Further, it will be apparent to those skilled in the art that the electronic device according to an embodiment of the present disclosure is not limited to the aforementioned devices.

Hereinafter, an electronic device according to an embodiment of the present disclosure will be described with reference to the accompanying drawings. The term "user" as used in various embodiments of the present disclosure may indicate a person who uses an electronic device or a device (e.g., artificial intelligence electronic device) that uses an electronic device.

FIG. 1 is a block diagram of an electronic device within a network environment according to various embodiments of the present disclosure.

Referring to FIG. 1, an electronic device 101 includes at least one of a bus 110, a processor 120, a memory 130, an input/output interface 150, a display 160, and a communication interface 170. According to an embodiment of the present disclosure, at least one of the components of the electronic device 101 may be omitted, or other components may be additionally included in the electronic device 101.

The bus 110 is a circuit that interconnects the aforementioned elements and transmits communication signals (e.g., control messages) between the aforementioned elements.

The processor 120 carries out operations or data processing related to control and/or communication of at least one other component (for example, the memory 130, the input/output interface 150, the display 160, or the communication interface 170) of the electronic device 101.

The memory 130 stores commands or data (e.g., a reference pattern or a reference touch area) associated with one or more other components of the electronic device 101. According to one embodiment of the present disclosure, the memory 130 stores software and/or a program 140. For example, the program 140 includes a kernel 141, a middleware 143, an application programming interface (API) 145, an application program 147, and the like, with one or more of the kernel 141, the middleware 143, and the API 145 being referred to as an operating system (OS).

The kernel 141 controls or manages system resources (e.g., the bus 110, the processor 120, or the memory 130) used for performing an operation or function implemented by the other programs (e.g., the middleware 143, the API 145, or the application program 147). Furthermore, the kernel 141 provides an interface through which the middleware 143, the API 145, or the application program 147 may access the individual elements of the electronic device 101 to control or manage the system resources.

The middleware 143, for example, functions as an intermediary for allowing the API 145 or the application program 147 to communicate with the kernel 141 to exchange data. In addition, the middleware 143 processes one or more task requests received from the application program 147 according to priorities thereof. For example, the middleware 143 assigns priorities for using the system resources (e.g., the bus 110, the processor 120, the memory 130, and the like) of the electronic device 101, to at least one application of the application program 147. For example, the middleware 143 performs scheduling or loading balancing on the one or more task requests by processing the one or more task requests according to the priorities assigned thereto.

The API 145 is an interface through which the application 147 controls functions provided from the kernel 141 or the middleware 143, and may include, for example, at least one interface or function (e.g., instruction) for file control, window control, image processing, or text control.

The input/output interface 150 forwards instructions or data input from a user through an input/output device (e.g., various sensors, such as an acceleration sensor or a gyro sensor, and/or a device, such as a keyboard or a touch screen), to the processor 120, the memory 130, or the communication interface 170 through the bus 110. For example, the input/output interface 150 provides the processor 120 with data on a user' touch entered on a touch screen. Furthermore, the input/output interface 150 outputs instructions or data, received from, for example, the processor 120, the memory 130, or the communication interface 170 via the bus 110, through an output unit (e.g., a speaker or the display 160).

The display 160 includes, for example, a liquid crystal display (LCD), a light emitting diode (LED) display, an organic LED (OLED) display, a micro electro mechanical system (MEMS) display, an electronic paper display, and the like. The display 160, for example, displays various types of content (e.g., a text, images, videos, icons, symbols, and the like) for the user. The display 160 may include a touch screen and receive, for example, a touch, a gesture, proximity, a hovering input, and the like, using an electronic pen or the user's body part. According to an embodiment of the present disclosure, the display 160 may display a web page.

The communication interface 170, for example, sets communication between the electronic device 101 and an external device (e.g., a first external electronic device 102, a second external electronic device 104, or a server 106). For example, the communication interface 170 connects to a network 162 through wireless or wired communication to communicate with the external device (e.g., the second external electronic device 104 or the server 106).

The wireless communication may use at least one of, for example, long term evolution (LTE), LTE-advanced (LTE-A), code division multiple access (CDMA), wideband CDMA (WCDMA), universal mobile telecommunications system (UMTS), wireless broadband (WiBro), and global system for mobile communications (GSM), as a cellular communication protocol. In addition, the wireless communication may include, for example, a short range communication 164. The short-range communication 164 may include at least one of, for example, Wi-Fi, Bluetooth™ (BT), near field communication (NFC), and GPS.

Each of the first external electronic device 102 and the second external electronic device 104 may be a device which is the same as or different from the electronic device 101. According to an embodiment of the present disclosure, the server 106 may include a group of one or more servers. According to an embodiment of the present disclosure, all or a part of operations performed in the electronic device 101 can be performed in the other electronic device or multiple electronic devices (e.g., the first external electronic device 102 or the second external electronic device 104 or the server 106). According to an embodiment of the present disclosure, when the electronic device 101 should perform some functions or services automatically or by a request, the electronic device 101 may make a request for performing at least some functions related to the functions or services by another device (e.g., the first external electronic device 102, the second external electronic device 104, or the server 106) instead of performing the functions or services by itself. The first external electronic device 102, the second external electronic device 104, or the server 106 may perform a function requested from the electronic device 101 or an additional function and transfer the performed result to the electronic device 101. The electronic device 101 can provide the requested function or service to another electronic device by processing the received result as it is or additionally. To this end, for example, cloud computing, distributed computing, or client-server computing technology may be used.

Figure 2:
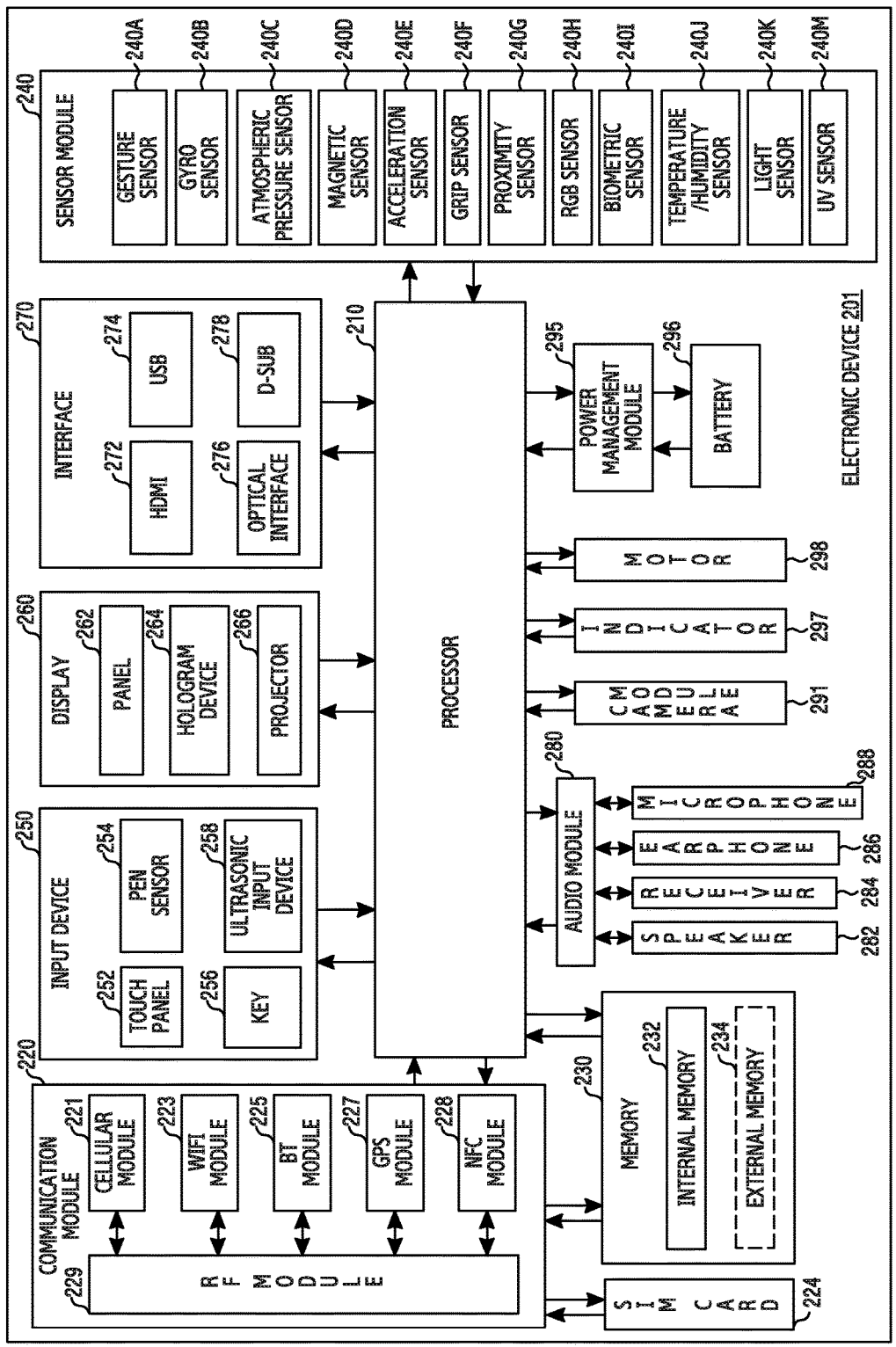
FIG. 2 is a block diagram of a flexible device according to various embodiments of the present disclosure.

FIG. 2 is a block diagram of a flexible device according to various embodiments of the present disclosure.

An electronic device 201 may constitute, for example, the entirety or a part of the electronic device 101 illustrated in FIG. 1, or may expand all or some elements of the electronic device 101.

Referring to FIG. 2, the electronic device 201 includes an application processor (AP) 210, a communication module 220, a subscriber identification module (SIM) card 224, a memory 230, a sensor module 240, an input device 250, a display 260, an interface 270, an audio module 280, a camera module 291, a power management module 295, a battery 296, an indicator 297, and a motor 298.

The AP 210 runs an operating system or an application program to control a plurality of hardware or software constituent elements connected to the AP 210, and may perform processing and operation of various data including multimedia data. The AP 210 may be, for example, implemented as a system on chip (SoC). According to an embodiment of the present disclosure, the AP 210 further includes a graphical processing unit (GPU). The AP 210 further includes at least one of other constitute elements (e.g., the cellular module 221). The AP 210 loads an instruction or data, which is received from a non-volatile memory connected to each or at least one of other constituent elements, to a volatile memory and processes the loaded instruction or data. In addition, the AP 210 stores in the non-volatile memory, data received from at least one of the other constituent elements or generated by at least one of the other constituent elements.

The communication module 220 (e.g., the communication interface 170) performs data transmission/reception in communication between the electronic device 201 (e.g., the electronic device 101) and other electronic devices connected through a network. According to an embodiment of the present disclosure, the communication module 220 includes a cellular module 221, a Wi-Fi module 223, a BT module 225, a GPS module 227, an NFC module 228, and a radio frequency (RF) module 229.

The cellular module 221 provides a voice telephony, a video telephony, a text service, an Internet service, and the like, through a telecommunication network (e.g., LTE, LTE-A, CDMA, WCDMA, UMTS, WiBro, GSM, and the like). In addition, the cellular module 221 may, for example, use a SIM card 224 to perform electronic device distinction and authorization within the telecommunication network. According to an embodiment of the present disclosure, the cellular module 221 may perform at least some of functions that the AP 210 may provide. For example, the cellular module 221 performs at least one part of a multimedia control function.

The Wi-Fi module 223, the BT module 225, the GPS module 227 and the NFC module 228 each may include, for example, a processor for processing data transmitted/received through the corresponding module. According to an embodiment of the present disclosure, at least some (e.g., two or more) of the cellular module 221, the Wi-Fi module 223, the BT module 225, the GPS module 227 and the NFC module 228 are included within one integrated circuit (IC) or IC package.

The RF module 229 performs transmission/reception of data, for example, transmission/reception of an RF signal. The RF module 229 may include, for example, a transceiver, a power amplifier module (PAM), a frequency filter, a low noise amplifier (LNA), an antenna and the like. According to an embodiment of the present disclosure, at least one of the cellular module 221, the Wi-Fi module 223, the BT module 225, the GPS module 227 or the NFC module 228 may perform transmission/reception of an RF signal through a separate RF module.

The SIM card 224 includes a SIM, and may be inserted into a slot provided in a specific position of the electronic device 201. The SIM card 224 includes unique identification information (e.g., an IC card identifier (ICCID)) or subscriber information (e.g., an international mobile subscriber identity (IMSI)).

The memory 230 includes an internal memory 232 or an external memory 234. The internal memory 232 includes, for example, at least one of a volatile memory (e.g., a dynamic random access memory (DRAM), a static RAM (SRAM) and a synchronous DRAM (SDRAM)) or a non-volatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a NAND flash memory, and a NOR flash memory).

According to an embodiment of the present disclosure, the internal memory 232 may be a solid state drive (SSD). The external memory 234 may further include a flash drive, for example, compact flash (CF), secure digital (SD), micro-SD, mini-SD, extreme digital (xD), a memory stick, and the like. The external memory 234 may be operatively connected with the electronic device 201 through various interfaces.

The sensor module 240 measures a physical quantity or detects an activation state of the electronic device 101, and converts measured or detected information into an electric signal. The sensor module 240 includes, for example, at least one of a gesture sensor 240A, a gyro sensor 240B, an air pressure sensor 240C, a magnetic sensor 240D, an acceleration sensor 240E, a grip sensor 240F, a proximity sensor 240G, a color sensor 240H (e.g., a red, green, blue (RGB) sensor), a bio-physical sensor 240I, a temperature/humidity sensor 240J, an illumination sensor 240K, an ultraviolet (UV) sensor 240M, and the like. Additionally or alternatively, the sensor module 240 may also include, for example, an E-nose sensor, an electromyography (EMG) sensor, an electroencephalogram (EEG) sensor, an electrocardiogram (ECG) sensor, an infrared (IR) sensor, an iris sensor, a fingerprint sensor, and the like. The sensor module 240 may further include a control circuit for controlling at least one or more sensors belonging therein.

The input device 250 includes a touch panel 252, a (digital) pen sensor 254, a key 256, an ultrasonic input device 258, and the like. The touch panel 252 may, for example, detect a touch input in at least one of a capacitive overlay scheme, a pressure sensitive scheme, an infrared beam scheme, and an acoustic wave scheme. The touch panel 252 may also include a control circuit. In a case of the capacitive overlay scheme, physical contact or proximity detection is possible. The touch panel 252 may further include a tactile layer, to provide a tactile response to a user.

The (digital) pen sensor 254 may be implemented in the same or similar method to receiving a user's touch input or by using a separate sheet for detection. The key 256 may include, for example, a physical button, an optical key, or a keypad. The ultrasonic input device 258 is capable of identifying data by detecting a sound wave in the electronic device 201 through an input tool generating an ultrasonic signal, and enables wireless detection. According to an embodiment of the present disclosure, the electronic device 201 may also use the communication module 220 to receive a user input from a connected external device (e.g., a computer or a server).

The display 260 (e.g., the display 160) includes a panel 262, a hologram device 264, or a projector 266. The panel 262 may be, for example, an LCD, an active-matrix organic LED (AMOLED), and the like. The panel 262 may be, for example, implemented to be flexible, transparent, or wearable. The panel 262 may be constructed as one module along with the touch panel 252 as well. The hologram device 264 may use interference of light to show a three-dimensional image in the air. The projector 266 may project light to a screen to display an image. The screen may be, for example, located inside or outside the electronic device 201. According to an embodiment of the present disclosure, the display 260 may further include a control circuit for controlling the panel 262, the hologram device 264, or the projector 266.

The interface 270 includes, for example, a high-definition multimedia interface (HDMI) 272, a universal service bus (USB) 274, an optical interface 276, or a D-subminiature (D-sub) 278. Additionally or alternatively, the interface 270 includes, for example, a mobile high-definition link (MHL) interface, an SD card/multimedia card (MMC) interface or an infrared data association (IrDA) standard interface.

The audio module 280 converts a voice and an electric signal interactively. The audio module 280 may, for example, process sound information which is inputted or outputted through a speaker 282, a receiver 284, an earphone 286, the microphone 288, and the like.

The camera module 291 takes still pictures and moving pictures. According to an embodiment of the present disclosure, the camera module 291 includes one or more image sensors (e.g., a front sensor or a rear sensor), a lens, an image signal processor (ISP), or a flash (e.g., an LED or a xenon lamp).

The power management module 295 manages electric power of the electronic device 201. The power management module 295 includes, for example, a power management IC (PMIC), a charger IC, a battery, a battery gauge, and the like.

The PMIC may be, for example, mounted within an integrated circuit or an SoC semiconductor. A charging scheme may be divided into a wired charging scheme and a wireless charging scheme. The charger IC charges the battery 296, and prevents the inflow of overvoltage or overcurrent from an electric charger. According to an embodiment of the present disclosure, the charger IC includes a charger IC for at least one of the wired charging scheme or the wireless charging scheme. The wireless charging scheme may, for example, be a magnetic resonance scheme, a magnetic induction scheme, an electromagnetic wave scheme, and the like. A supplementary circuit for wireless charging, for example, a circuit, such as a coil loop, a resonance circuit, a rectifier, and the like, may be added.

The battery gauge may, for example, measure a level of the battery 296, a voltage during charging, a current or a temperature. The battery 296 generates or stores electricity, and uses the stored or generated electricity to supply power to the electronic device 201. The battery 296 may include, for example, a rechargeable battery or a solar battery.

The indicator 297 displays a specific status of the electronic device 201 or one part (e.g., the AP 210) thereof, for example a booting state, a message state, a charging state, and the like. The motor 298 may convert an electric signal into a mechanical vibration. The electronic device 101 may include a processing device (e.g., a GPU) for mobile TV support. The processing device for mobile TV support may, for example, process media data according to the standards of digital multimedia broadcasting (DMB), digital video broadcasting (DVB), a media flow, and the like.

Each of the above-described elements of the electronic device may include one or more components, and the name of a corresponding element may vary according to the type of electronic device. The electronic device according to an embodiment of the present disclosure may include at least one of the above-described elements and may exclude some of the elements or further include other additional elements. Further, some of the elements of the electronic device according to an embodiment of the present disclosure may be coupled to form a single entity while performing the same functions as those of the corresponding elements before the coupling.

Figure 3:
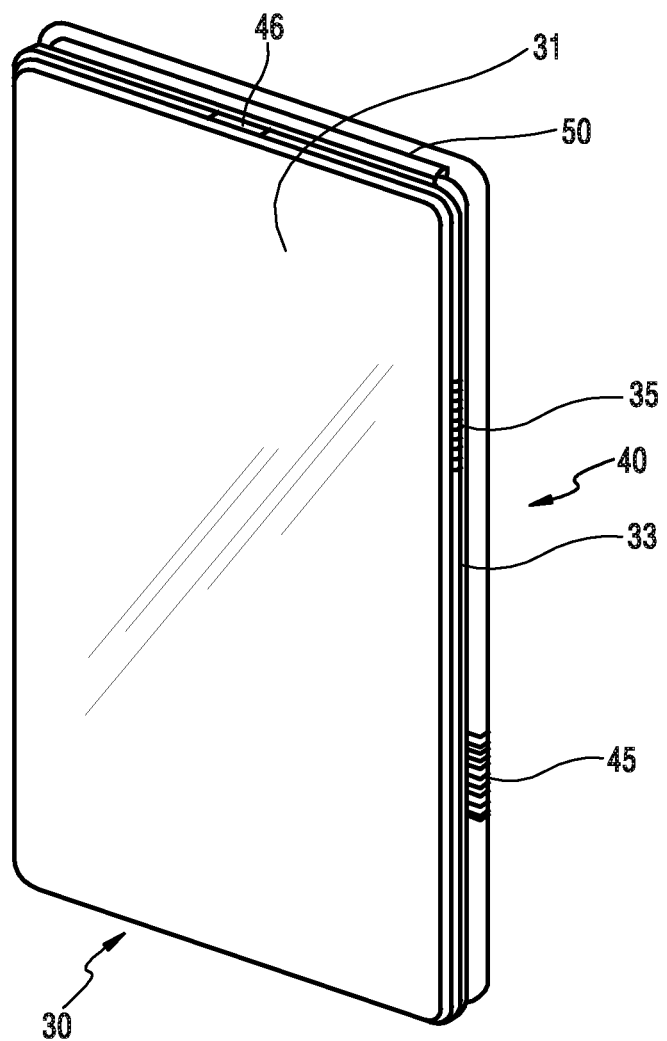
FIG. 3 is a view illustrating a front face of a flexible device according to various embodiments of the present disclosure.
Figure 4:
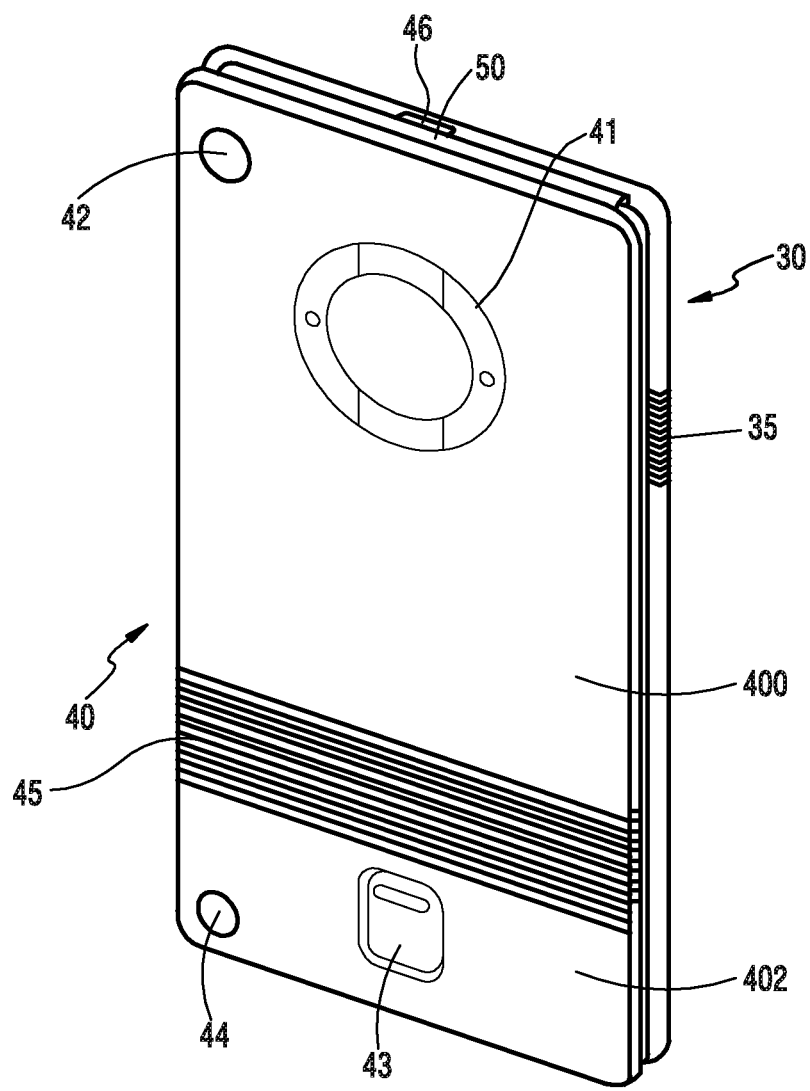
FIG. 4 is a view illustrating a rear face of a flexible device according to various embodiments of the present disclosure.
Figure 5:
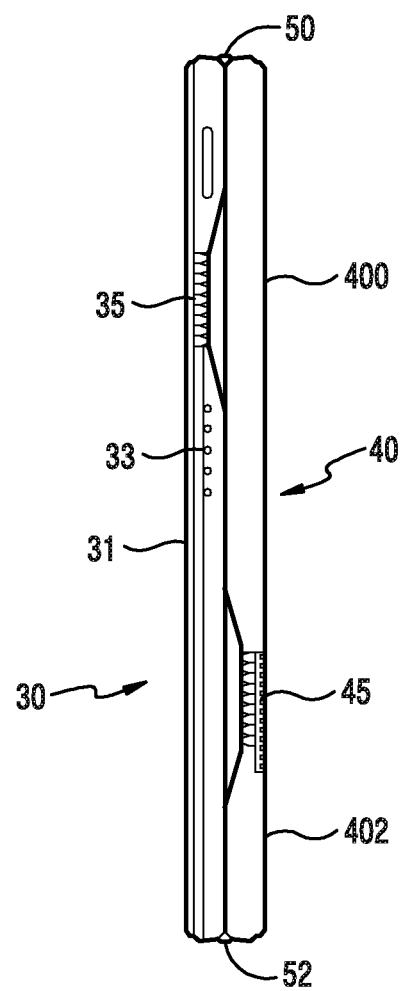
FIG. 5 is a side view illustrating a flexible device according to various embodiments of the present disclosure.

FIG. 3 is a view illustrating a front face of a flexible device according to various embodiments of the present disclosure. FIG. 4 is a view illustrating a rear face of a flexible device according to various embodiments of the present disclosure. FIG. 5 is a side view illustrating a flexible device according to various embodiments of the present disclosure.

Referring to FIGS. 3 to 5, a flexible device according to various embodiments of the present disclosure is mounted with a flexible display 31 and will be referred to as a flexible device. However, the flexible device according to various embodiments of the present disclosure may also be referred to as an electronic device that includes, for example, a mobile device, a smart phone, or a tablet PC. In addition, the flexible device according to various embodiments of the present disclosure may be formed in a configuration in which each of two main bodies is folded in order to provide an optimal UI/UX environment and an expanded UI/UX environment in various modes.

According to various embodiments of the present disclosure, the flexible device may include a front body 30, a rear body 40, and a connecting body 50 or 52. According to various embodiments of the present disclosure, in the first state of the flexible device, the main body of the front body 30 is disposed in the front side region of the flexible device, and thus, the front body 30 is defined as the "front body." In the same state, the main body of the rear body 40 is disposed in the front side region of the flexible device, and thus, the rear body 40 is defined as the "rear body." The connecting bodies 50 and 52 are portions that integrally interconnect the front body 30 and the rear body 40, and are thus defined as connecting bodies. The connecting bodies 50 and 52 may include a mechanical connection and/or an electric connection.

The front body 30 is a bar-type main body and may include a first external face and a first internal face. The first internal face may be a face that is opposite to the first external face, and faces the rear body. The front body 30 may include a folding portion 35 at a certain position. Accordingly, the front body 30 may be folded about the first folding portion 35. The first external face may be divided by the first folding portion 35.

A full-flexible display 31 may be disposed on the first external face of the front body 30. In other words, only the flexible display 31 may be disposed on the first external face. In this case, the flexible display 31 may be divided into three display regions by the first folding portion 35, and this structure will be described later (see FIG. 20).

The rear body 40 is a bar-type main body and may include a second external face and a second internal face. The second internal face may be a face that is opposite to the second external face, and faces the front body 30. The rear body 40 may include a second folding portion 45 at a certain position. Accordingly, the rear body 40 may be folded about the second folding portion 45. The second external face may be divided into first and second regions by the second folding portion 45. At least one functional device may be disposed on the second external face. The functional device may include, for example, an internal camera 44, a detachable camera 410 (see FIG. 10), and a flash 42. The detachable camera 410 may be disposed in a first region 400, and the internal camera 44 and a home key 43 may be disposed in a second region 402. Reference numeral 41 denotes a camera mounting portion. The camera mounting portion 41 may be provided with an opening so that a hook portion of the detachable camera may be inserted into the opening.

According to various embodiments of the present disclosure, in the first state of the flexible device, the front body 30 and the rear body 40 are arranged to be parallel to each other while maintaining the facing state therebetween, and in the second state, the front body 30 and the rear body 40 are folded along the first and second folding portions 35 and 45, respectively, such that at least a portion of the front body 30 is disposed in a rear side region and at least a portion of the rear body 40 is disposed in the front side region. In other words, the front body 30 may be folded by a certain angle around the first folding portion 35, and the rear body 40 may be folded by a certain angle around the second folding portion 45. With such an operation, the flexible device may be switched from the first state to the second state.

There are provided two connecting bodies (i.e., a first connecting body 50 that interconnects one end of the front body 30 and one end of the rear body 40, and a second connecting body 52 that interconnects the other end of the front body 30 and the other end of the rear body 40). Each of the first and second connecting bodies 50 and 52 may be made of a flexible material. Each of the first and second connecting bodies 50 and 52 may include a flexible printed circuit board (FPCB). In other words, the first connecting body 50 and/or the second connecting body 52 may be an FPCB. Accordingly, the first and second connecting bodies 50 and 52 may include a mechanical connecting function and an electrical connecting function. The front body 30 and the rear body 40 may be integrally and electrically connected to each other by the first and second connecting bodies 50 and 52.

The first and second folding portions 35 and 45 may be symmetrically arranged with reference to the center of the flexible device. However, the arranged positions of the first and second folding portions 35 and 45 are not limited.

Each of the front body 30 and the rear body 40 is mounted with a circuit board on which various electronic components (not illustrated) are mounted, and a rigid board or a board made of a flexible material may be mounted on each of the front body 30 and the rear body 40. In addition, a plurality of circuit boards may be provided in a segmented type (or an articulated type). The segmented boards may be connected by an FPCB. In addition, the circuit boards mounted on the front body 30 and the rear body 40 may be electrically connected to each other by a connecting portion.

In addition, as batteries for supplying power, a main battery may be disposed in the front body 30, and at least one battery may be mounted on the rear body 40.

Figure 6:
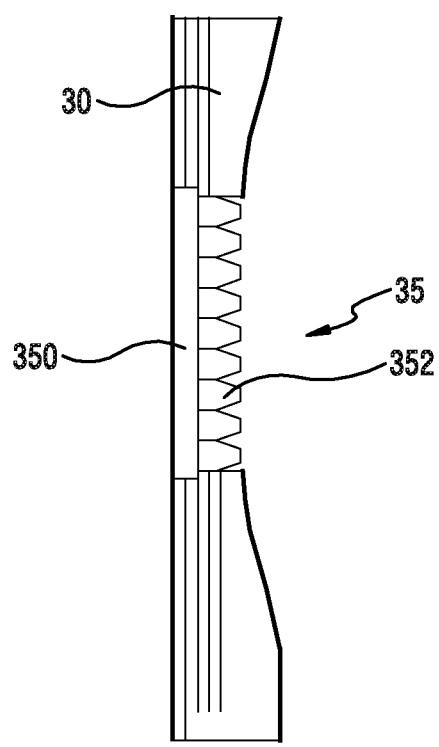
FIG. 6 is a view illustrating a folding portion of a flexible device according to various embodiments of the present disclosure in an unfolded state.
Figure 7:
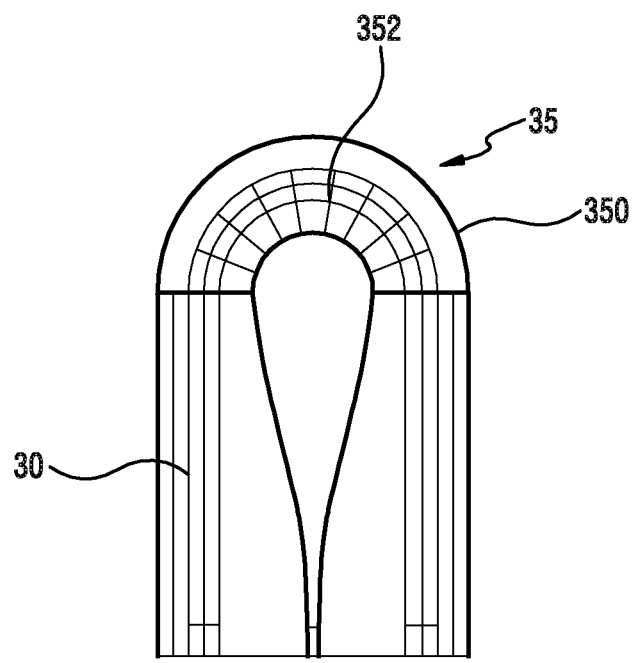
FIG. 7 is a view illustrating a folding portion of a flexible device according to various embodiments of the present disclosure in a folded state.

FIG. 6 is a view illustrating a folding portion of a flexible device according to various embodiments of the present disclosure in an unfolded state. FIG. 7 is a view illustrating a folding portion of a flexible device according to various embodiments of the present disclosure in a folded state.

Referring to FIGS. 6 and 7, according to various embodiments of the present disclosure, the flexible device may include first and second folding portions 35 and 45. The first folding portion 35 may be provided to the front body 30, and the second folding portion 45 may be provided to the rear body 40, so that the first folding portion 35 and the second folding portion 45 may be arranged symmetric to each other with reference to the center of the flexible device. Since the configurations of the first and second folding portions 35 and 45 are the same, only the first folding portion 35 will be described and the descriptions for the configuration of the second folding portion will be omitted.

The folding portion 35 may include a flexible material portion 350 and a plurality of folding members 352. The flexible material portion 350 is a portion that is folded when the first folding portion 35 is folded, and the plurality of folding members 352 may be fixed to the flexible material portion 350. The folding members 352 are fixed to the flexible material portion 350 to be parallel to each other so that the folding members 352 can perform the folding operation. Each of the folding members 352 may be made of a hard material (e.g., a metallic material). The folding members 352 may maintain a state in which the equal sides of the folding members 352 are spaced apart from each other in the unfolded state as illustrated in FIG. 6, and may maintain a state in which the equal sides are in close contact with each other in the folded state as illustrated in FIG. 7.

Figure 8:
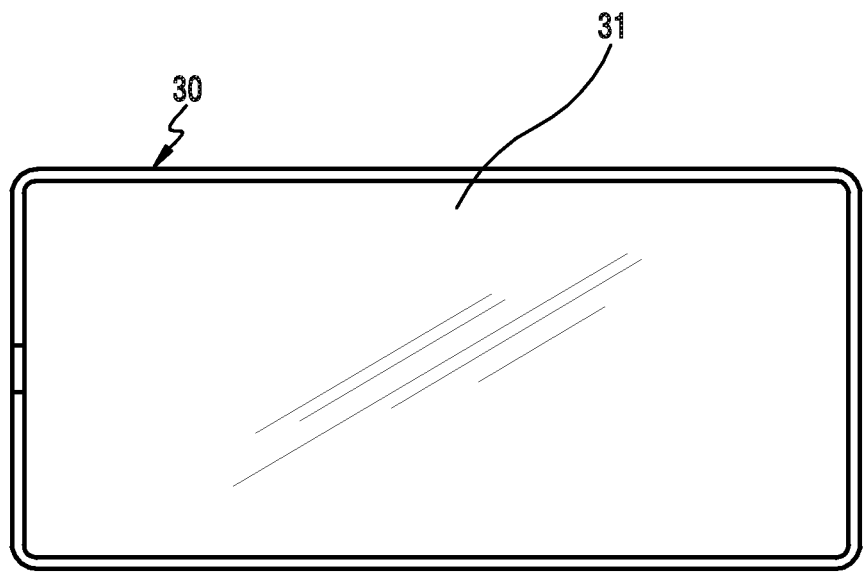
FIG. 8 is a front view illustrating a flexible device, in a first state, according to various embodiments of the present disclosure.
Figure 9:
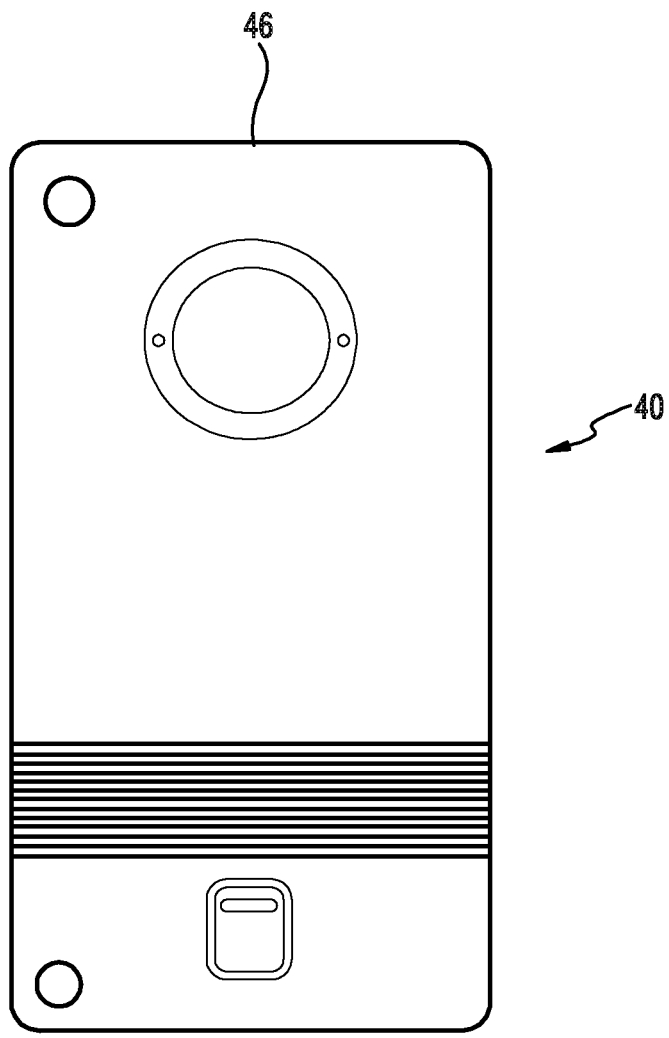
FIG. 9 is a rear view illustrating a flexible device, in a first state, according to various embodiments of the present disclosure.
Figure 10:
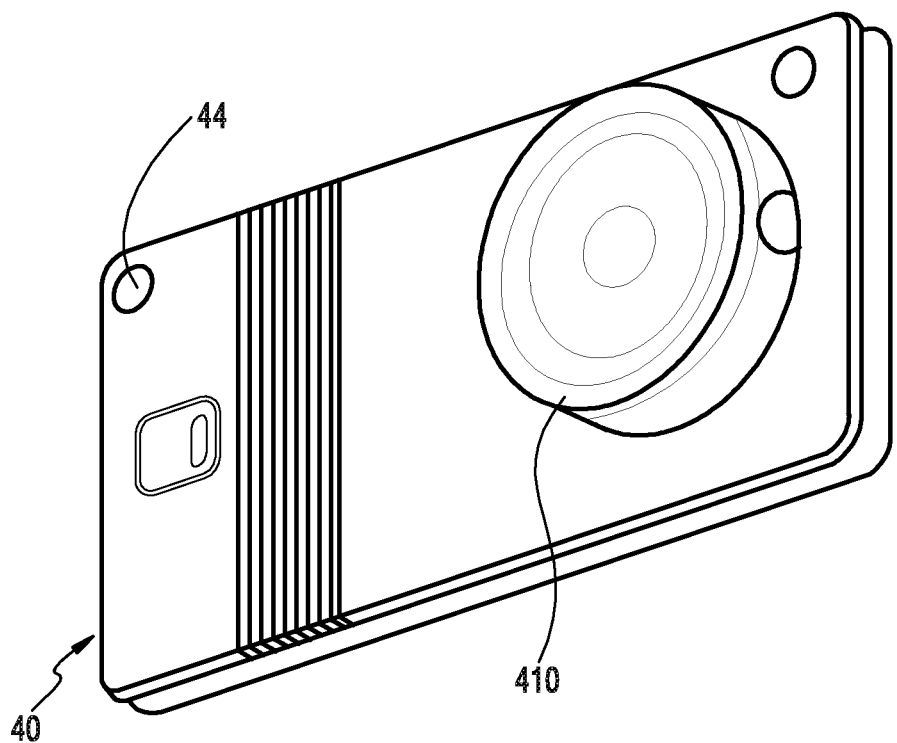
FIG. 10 is a view illustrating a state in which a detachable camera is mounted on a flexible device, in a first state, according to various embodiments of the present disclosure.

Hereinafter, descriptions will be made on the first state of the flexible device according to various embodiments of the present disclosure with reference to FIGS. 8 to 10. As illustrated in FIGS. 8 to 10, the first state of the flexible device may include a content watch mode (FIG. 8), a call mode (FIG. 9), and a camera photographing mode (FIG. 10).

FIG. 8 is a front view illustrating a flexible device, in a first state, according to various embodiments of the present disclosure.

Referring to FIG. 8, since the first external face of the front body 30 is a full display region in which the full-flexible display is disposed, it is convenient to enjoy a movie, to watch a drama, or to play a game. In the first state, the first external face may be utilized as a display region over the entire area thereof. More particularly, the flexible display has an aspect ratio of 21:9 so that various contents can be realistically watched.

FIG. 9 is a rear view illustrating a flexible device, in a first state, according to various embodiments of the present disclosure.

Referring to FIG. 9, a receiver hole duct (opening) 46 is formed in the upper end of the rear body so as to make a voice call.

FIG. 10 is a view illustrating a state in which a detachable camera is mounted on a flexible device, in a first state, according to various embodiments of the present disclosure.

Referring to FIG. 10, when the detachable camera 410 is mounted on the camera mounting portion of the rear body 40 in the first state, it may be the camera photographing mode. The flexible display may be a view region. More particularly, when the internal camera 44 and the detachable camera 410 are disposed together on the second external face of the rear body 40, it is possible to perform 3D camera photographing using both the cameras 44 and 410.

FIGS. 11A to 11E are views illustrating, in a stepwise manner, a mode switching operation of a flexible device according to various embodiments of the present disclosure.

Descriptions will be made on a mode switching operation of the flexible device according to various embodiments of the present disclosure with reference to FIGS. 11A to 11E.

Figure 11:
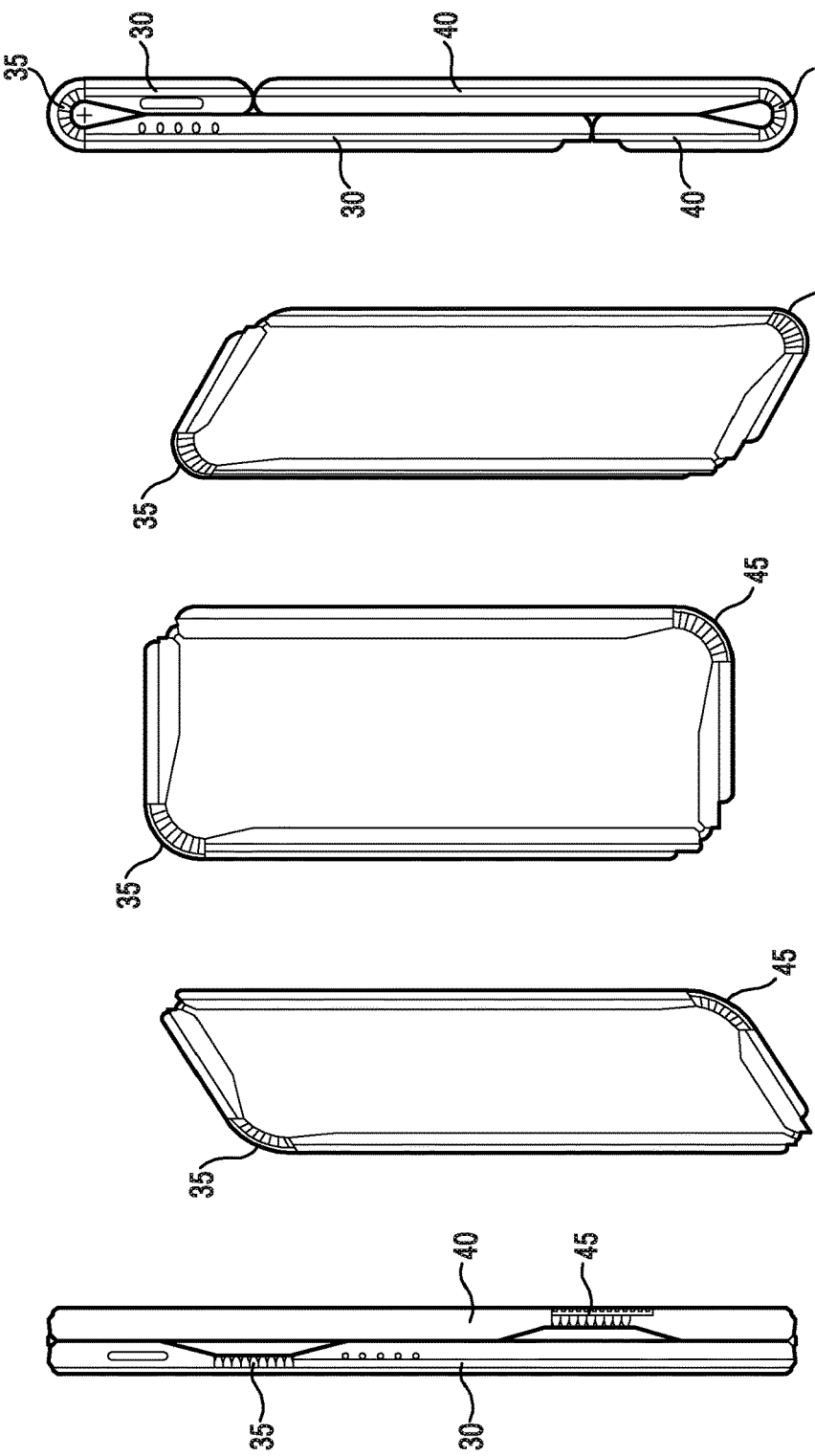
FIGS. 11A to 11E are views illustrating, in a stepwise manner, a mode switching operation of a flexible device according to various embodiments of the present disclosure.

Referring to FIGS. 11A to 11E, according to various embodiments of the present disclosure, when the front body 30 and the rear body 40 are folded by a certain angle about the first folding portion 35 and the second folding portion 45, respectively, the flexible device is switched from the first state (i.e., the state illustrated in FIG. 11A) to the state as illustrated in FIG. 11B.

Subsequently, when the front body 30 and the rear body 40 are further folded from the state of FIG. 11B by a certain angle about the first folding portion 35 and the second folding portion 45, respectively, the flexible device is switched to the state as illustrated in FIG. 11C. In the state as illustrated in FIG. 11C, the front body 30 and the rear body 40 are folded and disposed by the first and second folding portions 35 and 45, respectively, such that the flexible device has a substantially rectangular shape when the flexible device is viewed from a side. When the front body 30 and the rear body 40 are further folded from the state of FIG. 11C by a certain angle about the first folding portion 35 and the second folding portion 45, respectively, the flexible device is switched to the state as illustrated in FIG. 11D. In the state as illustrated in FIG. 11D, the flexible device may be automatically switched to the state as illustrated in FIG. 11E (i.e., the second state). Although the meaning of the term "automatically" may be further described later, it may mean that magnetic bodies are disposed on the front body 30 and the rear body 40, respectively, to generate an attractive force between the magnetic bodies so that the switching operation to the second state is performed even if no external force is applied.

Descriptions will be made on the second state of the flexible device according to various embodiments of the present disclosure with reference to FIGS. 12 to 15.

Figure 12:
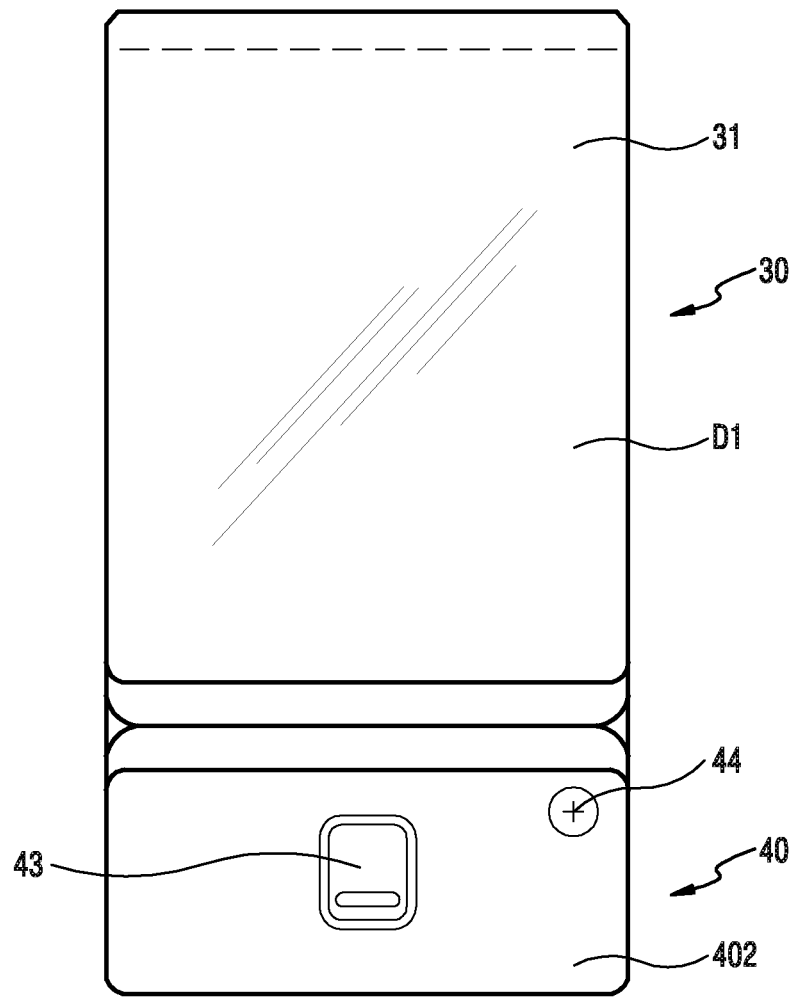
FIG. 12 is a front view illustrating a flexible device in a second state, according to various embodiments of the present disclosure.
Figure 13:
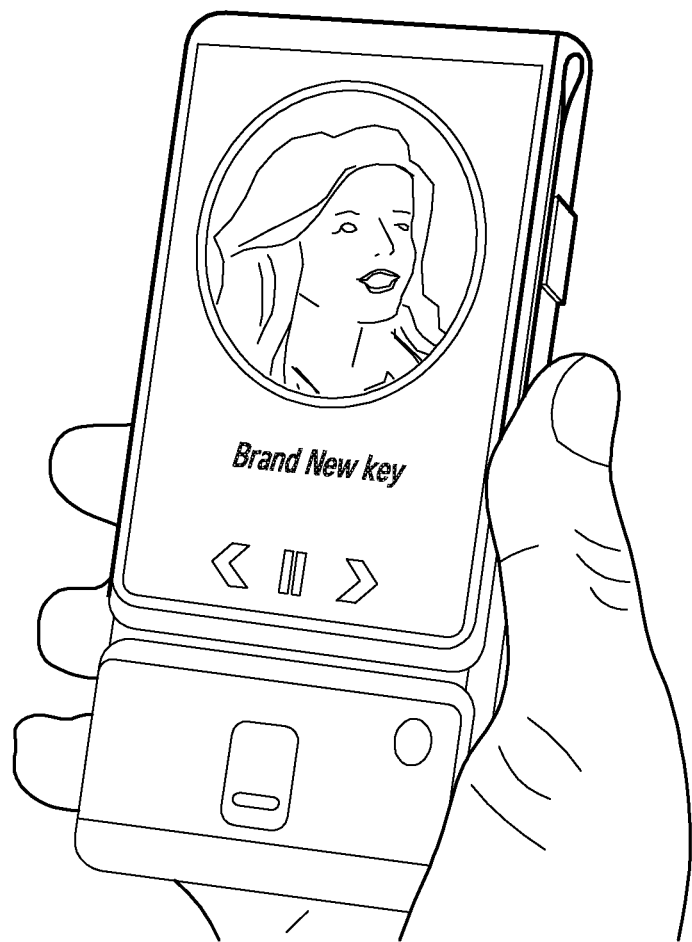
FIG. 13 is a view illustrating a flexible device, in a second state, according to various embodiments of the present disclosure.

FIG. 12 is a front view illustrating a flexible device in a second state, according to various embodiments of the present disclosure. FIG. 13 is a view illustrating a flexible device, in a second state, according to various embodiments of the present disclosure.

Referring to FIGS. 12 and 13, the second state of the flexible device may include, for example, a video call mode, a self-camera photographing mode, or a camera photographing mode. In the second state of the flexible device according to various embodiments of the present disclosure, a first display region D1 of the front body 30 and a second display region 402 may be disposed to be parallel with each other in the front side region. In the second region 402, the home key 43 and the internal camera 44 may be included. The home key 43 may include a fingerprint recognition sensor. In addition, any other functional component may be mounted on the first region instead of the detachable camera.

According to various embodiments of the present disclosure, a touch sensitive panel (TSP) may be configured on the flexible display 31, which is disposed on the first external face of the front body 30. When the TSP is configured on the flexible display, the flexible display 31 may be referred to as a flexible touch screen. Hereinafter, the terms, "flexible display" and "touch screen" will be interchangeably used.

On the display region of the flexible display (D1+D2+D3 in FIG. 20), a touch screen may be disposed. The main home screen refers to the first screen that is displayed on the touch screen 31 when the power of the flexible device is turned on. In addition, when the flexible device has several pages of different home screens, the main home screen may be the first home screen among the several pages of home screens. The home screen may display shortcut icons to execute frequently used applications, a main menu switching key, time, weather, and the like. The main menu switching key may cause the main screen to be displayed on the touch screen 31. In addition, in the upper end of the touch screen 31, status bars may be formed to indicate the statuses of the device, such as a battery charge status, a received signal strength, and the current time. A home button, a menu button, and a back button may be formed below the touch screen 31.

The home button causes the main home screen to be displayed on the touch screen 31. For example, when the home key is touched in the state where a home screen, which is different from the main home screen, or the menu screen is displayed on the touch screen 31, the main home screen may be displayed on the touch screen 31. In addition, when the home button is touched while applications are executed on the touch screen 31, the main home screen may be displayed on the touch screen 31. In addition, the home button may be used in order to cause the touch screen 31 to display the most recently used application or a task manager.

The menu button provides a connection menu that may be used on the touch screen 31. The connection menu may include, for example, a widget addition menu, a background screen change menu, a retrieve menu, an edition menu, or an environment setting menu. The back button may cause the screen, which was executed just prior to the currently executed screen, to be displayed, or may cause the most recently used application to be terminated.

According to various embodiments of the present disclosure, an illuminance sensor and a proximity sensor may be disposed on an edge of a front face of the flexible device. According to various embodiments of the present disclosure, for example, a power/reset button, a volume button, or one or more microphones may be arranged on a side face of the flexible device.

In addition, a connector is formed on the lower end side face of the flexible device. The connector may be formed with a plurality of electrodes, and may be connected to an external device via a wire. An earphone connecting jack may be arranged on the upper end side face of the flexible device. An earphone may be inserted into the earphone connecting jack. The earphone connecting jack may be arranged on the lower end side face of the flexible device. FIGS. 11A to 11E are views illustrating, in a stepwise manner, a mode switching operation of a flexible device according to various embodiments of the present disclosure.

Figure 14:
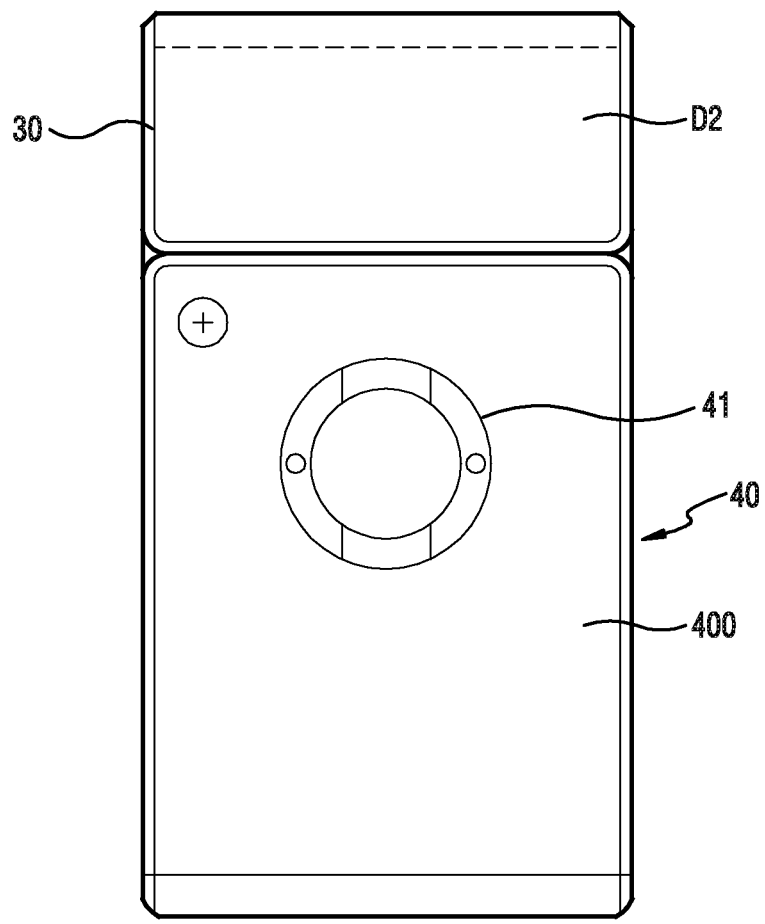
FIG. 14 is a rear view illustrating a flexible device, in a second state, according to various embodiments of the present disclosure.
Figure 15:
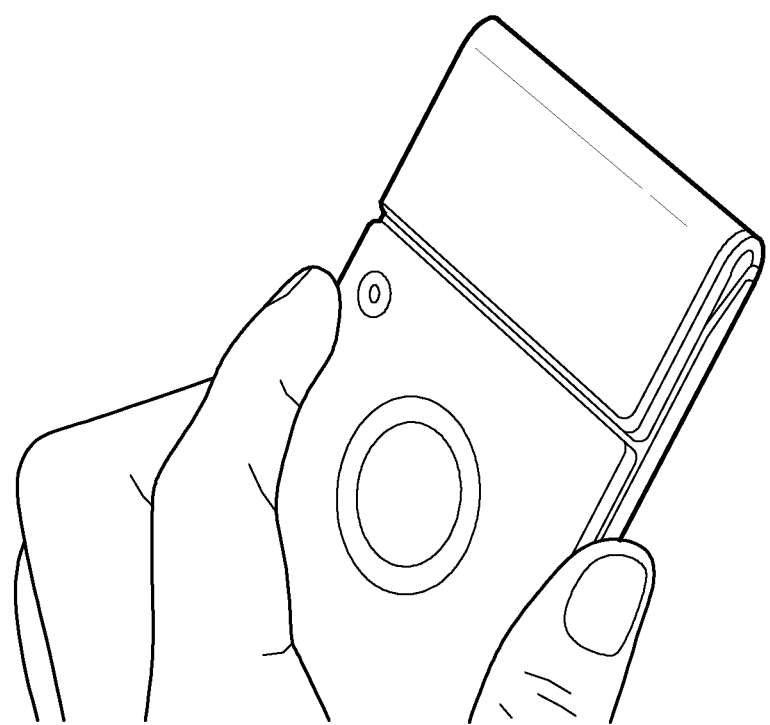
FIG. 15 is a view illustrating a flexible device, in a second state, according to various embodiments of the present disclosure.

FIG. 14 is a rear view illustrating a flexible device, in a second state, according to various embodiments of the present disclosure. FIG. 15 is a view illustrating a flexible device, in a second state, according to various embodiments of the present disclosure.

Referring to FIGS. 14 and 15, in the second state of the flexible device according to various embodiments of the present disclosure, the second display region D2 of the front body 30 and the first display region 400 of the rear body 40 may be disposed to be parallel with each other without overlapping with each other. In the first region 400, a detachable camera may be included. On the second display region D2, for example a UI related to a camera may be displayed.

Figure 16A:
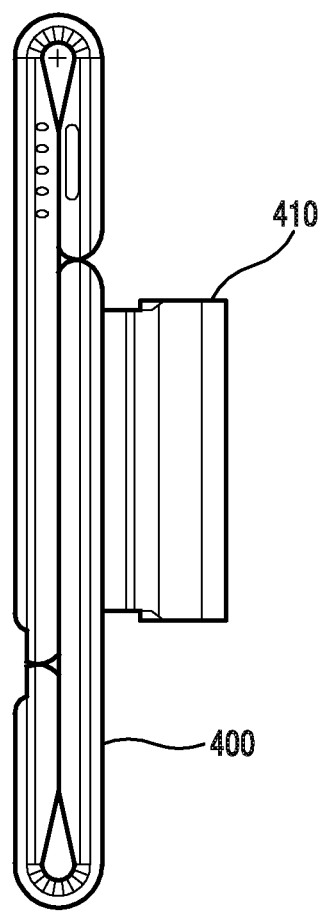
FIG. 16A is a view illustrating a state in which a detachable camera is mounted on a flexible device, in a second state, according to various embodiments of the present disclosure.
Figure 16B:
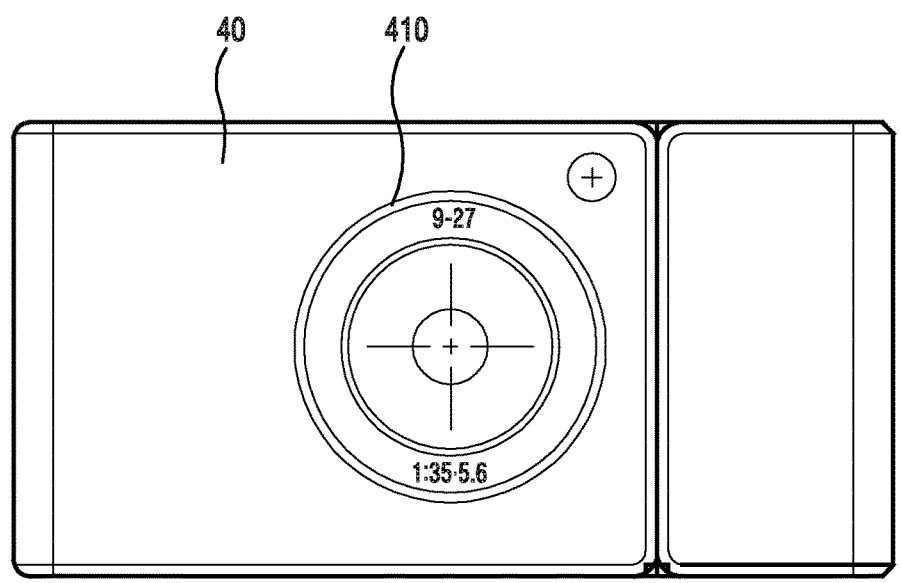
FIG. 16B is a front view illustrating a state in which a detachable camera is mounted on a flexible device, in a second state, according to various embodiments of the present disclosure.

FIG. 16A is a view illustrating a state in which a detachable camera is mounted on a flexible device, in a second state, according to various embodiments of the present disclosure. FIG. 16B is a front view illustrating a state in which a detachable camera is mounted on a flexible device, in a second state, according to various embodiments of the present disclosure.

Referring to FIGS. 16A and 16B, when the detachable camera 410 is mounted on the camera mounting portion of the rear body 40 in the second state, it may be the camera photographing mode. In the second state, the internal camera may be utilized as a front camera and the detachable camera 410 may be utilized as a rear camera.

Figure 17A:
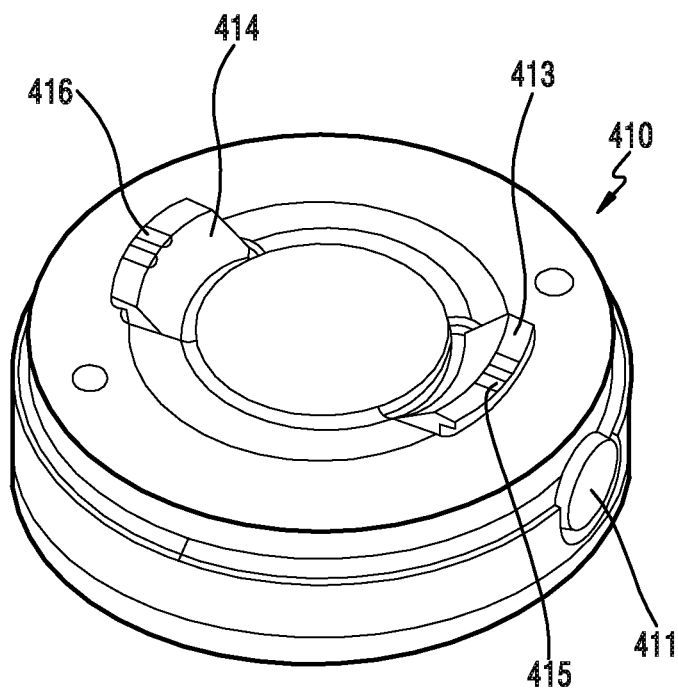
FIG. 17A is a view illustrating a rear side of a detachable camera according to various embodiments of the present disclosure.
Figure 17B:
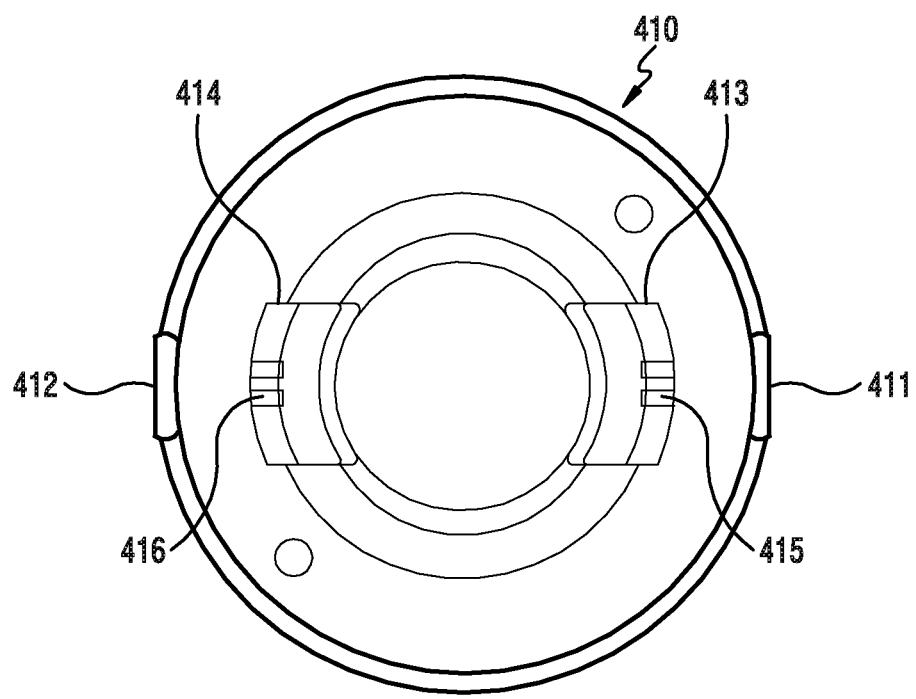
FIG. 17B is a rear view illustrating a rear side of a detachable camera according to various embodiments of the present disclosure.

FIG. 17A is a view illustrating a rear side of a detachable camera according to various embodiments of the present disclosure. FIG. 17B is a rear view illustrating a rear side of a detachable camera according to various embodiments of the present disclosure.

Referring to FIGS. 17A and 17B, according to various embodiments of the present disclosure, the flexible device may include the detachable camera 410 as a functional device. The detachable camera 410 may be attachable to/detachable from the camera mounting portion of the rear body. For this purpose, the detachable camera 410 may include first and second push buttons 411 and 412 that are disposed to be opposite to each other on the outer peripheral surface thereof. Each of the first and second push buttons 411 and 412 is arranged to be elastically moved by an elastic body (not illustrated) so that the first and second push buttons receive elastic forces in the direction where the first and second push buttons go away from each other.

The first and second push buttons 411 and 412 may include first and second hook portions 413 and 414, respectively. The first and second push hook portions 413 and 414 may include first and second connection terminals 415 and 416, respectively. At least one of the first and second connection terminals 415 and 416 may be configured in a pogo pin type. Each of the first and second push buttons 411 and 412 is movably mounted in the state of being supported by an elastic body so that the first and second push buttons 411 and 413 may be forcibly moved in the direction where the first and second push buttons come closer to each other. When the force applied to the first and second push buttons 411 and 412 is removed, the first and second push buttons 411 and 412 may be returned in the direction where the first and second push buttons 411 and 412 go away from each other.

Figure 18A:
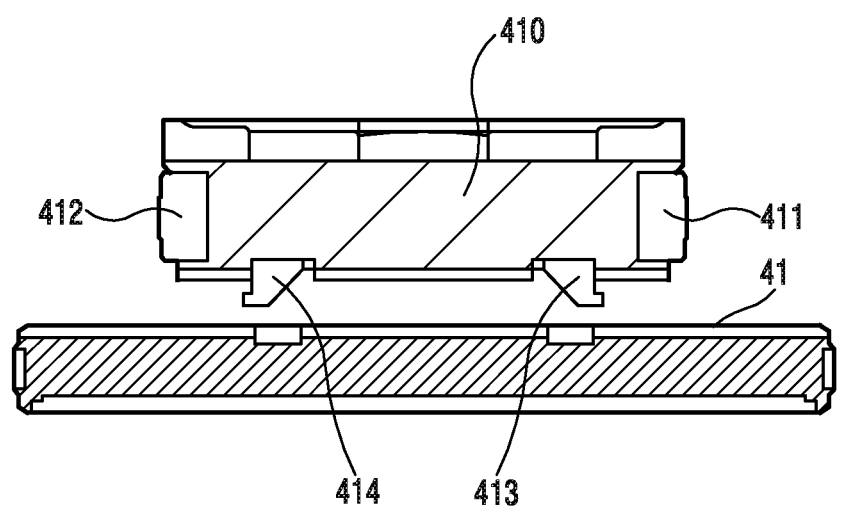
FIGS. 18A to 18C are sectional views, in a stepwise manner, of a process of attaching/detaching a detachable camera according to various embodiments of the present disclosure, respectively.
Figure 18B:
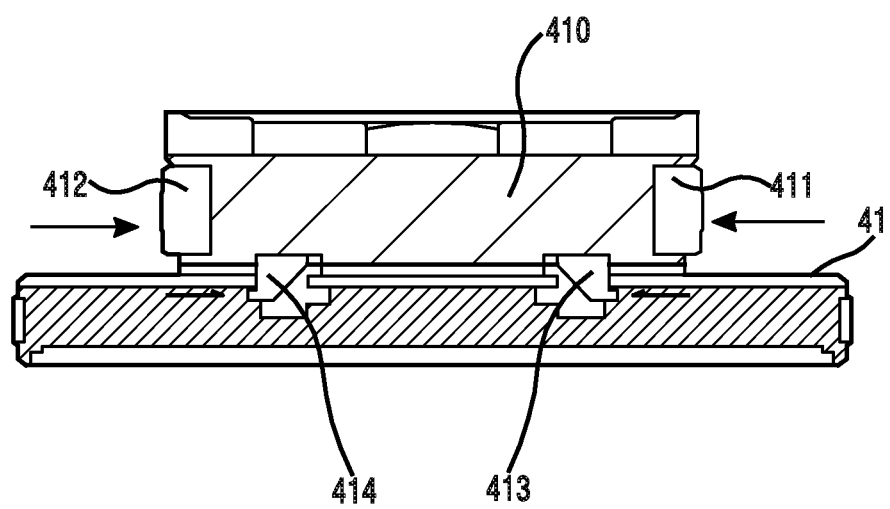
Figure 18C:
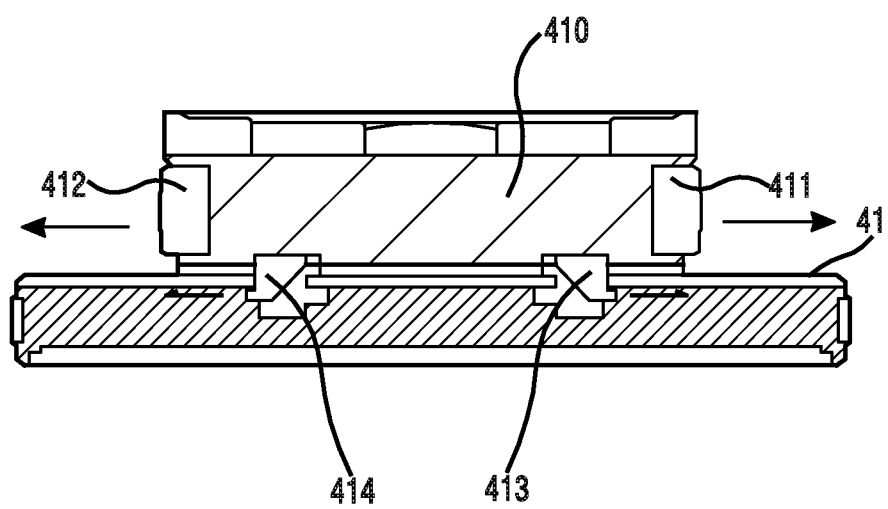

FIGS. 18A to 18C are sectional views illustrating, in a stepwise manner, of a process of attaching/detaching a detachable camera according to various embodiments of the present disclosure, respectively.

Referring to FIGS. 18A to 18C, a process of attaching/detaching the detachable camera 410 is illustrated. When it is desired to mount the detachable camera 410 on the camera mounting portion 41, the first and second push buttons 411 and 412 are pushed in the direction where the first and second push buttons 411 and 412 come closer to each other, then the first and second hook portions 413 and 414 are inserted into the camera mounting portion 41 while maintaining the pushed state, and then the pushing force is removed. Subsequently, the detachable camera 410 may be mounted on and connected to the camera mounting portion 41, and may maintain the connected state. In the process of separating the detachable camera, the first and second push buttons 411 and 412 are pushed in the direction where the first and second push buttons 411 and 412 come closer to each other, and then the first and second hook portions 413 and 414 may be removed from the camera mounting portion 41 while maintaining the pushed state.

Figure 19A:
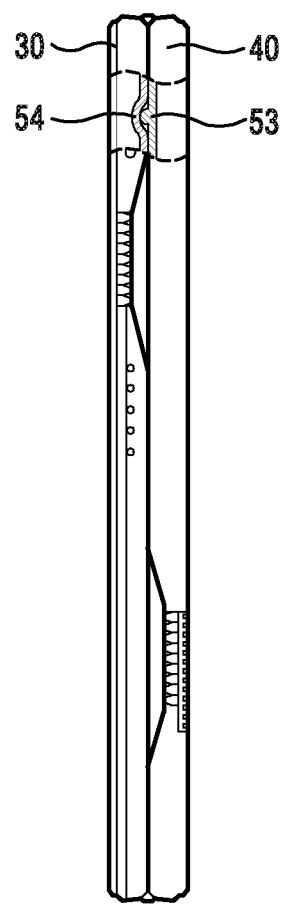
FIG. 19A is a view illustrating a holding device, which is partially cut away in a first state, according to various embodiments of the present disclosure.
Figure 19B:
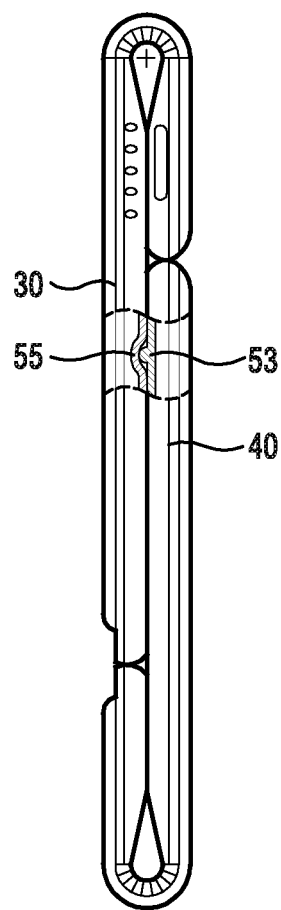
FIG. 19B is a view illustrating a holding device, which is partially cut away in a second state, according to various embodiments of the present disclosure.

FIG. 19A is a view illustrating a holding device, which is partially cut away in a first state, according to various embodiments of the present disclosure. FIG. 19B is a view illustrating a holding device, which is partially cut away in a second state, according to various embodiments of the present disclosure.

Referring to FIGS. 19A and 19B, according to various embodiments of the present disclosure, the flexible device may include a holding device. According to various embodiments of the present disclosure, the holding device is disposed between the front body 30 and the rear body 40 so as to hold the arrangement state during a mode switch operation.

The holding device may include a single protrusion 53 that is provided on a second inner face of the rear body 40, and first and second recesses 54 and 55 that are provided on the first inner face of the front body 30. In the first state, the single protrusion 53 is coupled to the first recess 54 (FIG. 19A), and in the second state, the single protrusion 53 may be coupled to the second recess 55 (FIG. 19B).

When the single protrusion 53 and the first and second recesses 54 and 55 are coupled to each other, the first state and the second state may be maintained without moving. In addition, when the holding device is made of a magnetic body (in other words, each of the single protrusion 53 and the first and second recesses 54 and 55), the holding device may provide a force (attractive force) in the direction where the holding device is to be disposed in the first state or in the direction where the holding device is to be disposed in the second state, and the single protrusion 53 and the first and second recesses 54 and 55 may provide a first state holding force or a second state holding force. Meanwhile, according to various embodiments of the present disclosure, magnetic bodies may be mounted at locations that are independent from the holding device, respectively. For example, a magnetic body may be mounted next to the holding device.

Figure 20:
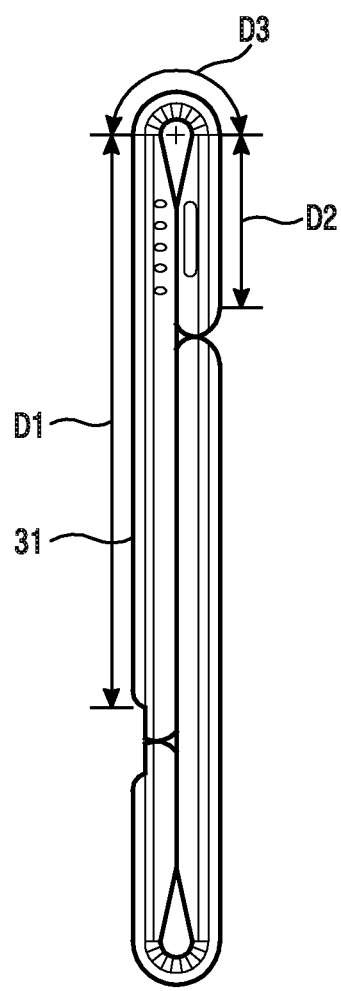
FIG. 20 is a view illustrating divided display regions of a flexible device, in the second state, according to various embodiments of the present disclosure.

FIG. 20 is a view illustrating divided display regions of a flexible device, in a second state, according to various embodiments of the present disclosure.

Referring to FIG. 20, according to various embodiments of the present disclosure, in the second state of the flexible device, the flexible display 31 region may be divided into three display regions D1, D2, and D3. The flexible display 31 region may include a first display region D1 that is disposed in the front side region and a second display region D2 that is disposed in the rear side region. In addition, the flexible display 31 may include a third display region D3 that is disposed between the first and second display regions D1 and D2. The first and second display regions D1 and D2 are flat regions, while the third display region D3 is a curved display region and may be at least partially utilized as a UI region or as an auxiliary display.

The first display region D1 has an aspect ratio of 4:3, and the second display region D2 may be disposed to have an aspect ratio of 21:9.

The term "module," as used herein may represent, for example, a unit including a combination of one or two or more of hardware, software, or firmware. The "module" may be, for example, used interchangeably with the terms "unit", "logic", "logical block", "component", or "circuit" and the like. The "module" may be the minimum unit of an integrally constructed component or a part thereof. The "module" may be also the minimum unit performing one or more functions or a part thereof. The "module" may be implemented mechanically or electronically. For example, the "module" may include at least one of an application-specific IC (ASIC) chip, field programmable gate arrays (FPGAs) and a programmable-logic device performing some operations known to the art or to be developed in the future.

At least a part of an apparatus (e.g., modules or functions thereof) or method (e.g., operations) according to an embodiment of the present disclosure may be, for example, implemented as instructions stored in a computer-readable storage medium in a form of a programming module. In case that the instruction is executed by a processor (e.g., processor 120), and the processor may perform functions corresponding to the instructions. The computer-readable storage media may be the memory 130, for instance.

The computer-readable recording medium may include a hard disk, a floppy disk, and a magnetic medium (e.g., a magnetic tape), an optical medium (e.g., a compact disc— ROM (CD-ROM) and a DVD), a magneto-optical medium (e.g., a floptical disk), and a hardware device (e.g., a ROM, a RAM, a flash memory, and the like). In addition, the program instruction may include not only a mechanical language code, such as a code made by a compiler but also a high-level language code executable by a computer using an interpreter, and the like. The aforementioned hardware device may be constructed to operate as one or more software modules in order to perform operations of the present disclosure, and vice versa.

The module or programming module according to an embodiment of the present disclosure may include at least one or more of the aforementioned constituent elements, or omit some of the aforementioned constituent elements, or further include additional other constituent elements. Operations carried out by the module, the programming module or the other constituent elements according to an embodiment of the present disclosure may be executed in a sequential, parallel, repeated or heuristic method. In addition, some operations may be executed in different order or may be omitted, or other operations may be added.

Accordingly, a method and electronic device are provided for controlling a display according to an embodiment of the present disclosure, to determine the priority of display based on a user's preference, thereby being able to decrease a search time for display and more quickly display a desired screen.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A flexible device comprising:
   a front body including a display and a first folding portion;
   a rear body including a second folding portion;
   a first connecting body connecting a first end of the front body and a first end of the rear body; and
   a second connecting body connecting a second end of the front body and a second end of the rear body,
   wherein the display includes a flexible display region disposed above the first folding portion, a first display region disposed between the first end of the front body and the flexible display region, and a second display region disposed between the second end of the front body and the flexible display region,
   wherein, in a first state in which the first folding portion and the second folding portion are unfolded, the front body and the rear body are arranged to be parallel with each other, the front body being on a front side region of the flexible device and the rear body being in a rear side region of the flexible device, and
   wherein, in a second state, the front body and the rear body are folded along the first folding portion and the second folding portion, respectively, such that the first display region and a first portion of the rear body are disposed in the rear side region, and the second display region and a second portion of the rear body are disposed in the front side region.

2. The flexible device of claim 1,
   wherein the display is the flexible display disposed on an external surface.

3. The flexible device of claim 2,
   wherein, in the first state, the flexible display provides a rectangular display region that has an aspect ratio of 21:9, and
   wherein, in the second state, the first display region provides a rectangular display region that has an aspect ratio of 4:3 and the second display region provides a rectangular display region that has an aspect ratio of 21:9.

4. The flexible device of claim 1,
wherein the flexible display region is a curved display region that is at least partially utilized as a user interface (UI) region.

5. The flexible device of claim 1,
wherein the rear body includes a second external face and a second internal face that is opposite to the second external face, and
wherein the second external face includes at least one functional device.

6. The flexible device of claim 5,
wherein the second external face is divided into a first region and a second region with reference to the second folding portion, and
wherein a detachable camera is disposed in the first region, and an internal camera and a home key are disposed in the second region.

7. The flexible device of claim 6,
wherein, in the second state, the second external face is folded about the second folding portion, and
wherein the internal camera and the home key are disposed in the front side region and the detachable camera is disposed in the rear side region.

8. The flexible device of claim 7,
wherein the first region where the detachable camera exists and the second display region are arranged to be parallel to each other not to overlap with the rear side region, and
wherein the first display region and the second region where the internal camera and the home key exist are arranged parallel to each other not to overlap with the front side region.

9. The flexible device of claim 6, wherein, in the second state, the second region acts as a grip portion.

10. The flexible device of claim 6, wherein, in the first state, three dimensional (3D) camera photographing is enabled by the internal camera and the detachable camera.

11. The flexible device of claim 6, wherein in the second state, the internal camera operates as a front camera and the detachable camera operates as a rear camera.

12. The flexible device of claim 6, wherein a structure, which attaches/detaches the detachable camera to/from the rear body, comprises:
first and second push buttons that are disposed on an outer peripheral surface of the detachable camera to be opposite to each other and are elastically moved in a direction where the first and second push buttons come closer to each other;
first and second hook portions that are moved together following the first and second push buttons, respectively; and
first and second connection terminals that are provided to the first and second hook portions, respectively,
wherein the detachable camera is attached/detached depending on whether the first and second push buttons are pushed.

13. The flexible device of claim 1, wherein the connecting body is made of a flexible material, and comprises:
a first connecting body that interconnects one end of the front body and one end of the rear body,
a second connecting body that interconnects another end of the front body and another end of the rear body, and
a flexible printed circuit board to electrically interconnect the front body and the rear body.

14. The flexible device of claim 1,
wherein a holding device is provided between the front body and the rear body to hold a disposed state during a mode switching operation,
wherein the holding device includes a magnetic body,
wherein the holding device further includes a single protrusion that is provided on a second inner face of the rear body, and first and second recesses that are provided on the first inner face of the front body, and
wherein the single protrusion is coupled to the first recess in the first state, and the single protrusion is coupled to the second recess in the second state.

15. The flexible device of claim 14, wherein the first and second recesses are disposed to be opposite to each other such that, with reference to the first folding portion, the first recess is disposed on one side and the second recess is disposed on another side.

16. The flexible device of claim 1, wherein the front body and the rear body are provided with first and second magnetic bodies, respectively, so as to provide a force in a direction to be disposed in the first state or in a direction to be disposed in the second state, and the first and second magnetic bodies provide a first state holding force or a second state holding force.

17. The flexible device of claim 1, wherein a receiver duct hole is further disposed at a side of an upper end of the front body.

18. The flexible device of claim 1, wherein the first and second folding portions are disposed symmetric to each other with reference to a center of the flexible device.

19. The flexible device of claim 1, wherein the front body is configured such that a plurality of touch keys are arranged on one side face to provide an input through a touch operation or a SWYPE operation.

20. A flexible device comprising:
a front body including:
a flexible display,
a first folding portion,
a flexible display region disposed above the first folding portion,
a first remaining region disposed on one side of the flexible display region, and
a second remaining region disposed on another side of the flexible display region,
wherein the first folding portion includes a first plurality of folding members which include isosceles trapezoidal protrusions that are disposed adjacent to each other,
wherein the flexible display region is thinner than the first remaining region and the second remaining region, and
wherein in a first state, in which the first folding portion is unfolded, equal sides of the first plurality of folding members are spaced apart from each other.

21. The flexible device of claim 20, wherein, in a second state in which the first folding portion is folded, equal sides of the first plurality of folding members are in close contact with each other.

22. The flexible device of claim 20 further comprising a rear body including a second folding portion,
wherein the second folding portion includes a flexible region disposed above the second folding portion and a second plurality of folding members which include isosceles trapezoidal protrusions and are disposed adjacent to each other.

23. The flexible device of claim 22, wherein, in the first state, the front body and the rear body are arranged to be parallel with each other, the front body being on a front side region of the flexible device and the rear body being on a rear side region of the flexible device.

24. The flexible device of claim 23, wherein, in a second state in which the first folding portion and the second folding portion are folded, equal sides of the second plurality of folding members and equal sides of the first plurality of folding members are in close contact with each other.

25. The flexible device of claim 24, wherein in the second state, the first remaining region of the front body is disposed in the rear side region, and the second remaining region of the front body is disposed in the front side region.

26. The flexible device of claim 22, further comprising:
a first connecting body connecting a first end of the front body and a first end of the rear body; and
a second connecting body connecting a second end of the front body and a second end of the rear body.

* * * * *